(12) United States Patent
Basker et al.

(10) Patent No.: US 9,299,703 B2
(45) Date of Patent: Mar. 29, 2016

(54) CMOS TRANSISTORS WITH IDENTICAL ACTIVE SEMICONDUCTOR REGION SHAPES

(71) Applicant: International Business Machines Corporation, Armonk, NY (US)

(72) Inventors: Veeraraghavan S. Basker, Schenectady, NY (US); Kangguo Cheng, Schenectady, NY (US); Ali Khakifirooz, Mountain View, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/515,831

(22) Filed: Oct. 16, 2014

(65) Prior Publication Data

US 2015/0255459 A1    Sep. 10, 2015

Related U.S. Application Data

(63) Continuation of application No. 14/197,631, filed on Mar. 5, 2014, now Pat. No. 9,059,311.

(51) Int. Cl.
*H01L 27/092* (2006.01)
*H01L 29/66* (2006.01)
*H01L 21/8234* (2006.01)
*H01L 21/8238* (2006.01)
*H01L 21/84* (2006.01)
(Continued)

(52) U.S. Cl.
CPC ...... *H01L 27/092* (2013.01); *H01L 21/823431* (2013.01); *H01L 21/823821* (2013.01); *H01L 21/845* (2013.01); *H01L 27/0886* (2013.01); *H01L 27/0924* (2013.01); *H01L 27/1211* (2013.01); *H01L 29/6656* (2013.01)

(58) Field of Classification Search
CPC ............................................... H01L 21/823807
See application file for complete search history.

(56) References Cited

U.S. PATENT DOCUMENTS 8,609,495 B2 * 12/2013 Gan .................. H01L 29/66795
257/204
2006/0084232 A1    4/2006  Grupp et al.
(Continued)

OTHER PUBLICATIONS

Notice of Allowance dated Apr. 6, 2015 received in the parent U.S. Appl. No. 14/197,631.

*Primary Examiner* — Mamadou Diallo
(74) *Attorney, Agent, or Firm* — Scully, Scott, Murphy & Presser, P.C.; Steven J. Meyers

(57) ABSTRACT

A disposable semiconductor material is deposited to form disposable semiconductor material portions on semiconductor fins. A first dielectric liner is deposited and patterned to form openings above a first set of disposable semiconductor material portions on a first semiconductor fin. The first set of disposable semiconductor material portions is replaced with a first set of active semiconductor regions by a combination of an etch and a selective epitaxy process that deposits a first semiconductor material. A second dielectric liner is deposited and patterned to form openings above the second set of disposable semiconductor material portions. The second set of disposable semiconductor material portions is replaced with a second set of active semiconductor regions employing another epitaxy process that deposits a second semiconductor material. The active semiconductor regions can have the same faceting profile irrespective of the semiconductor materials therein.

16 Claims, 18 Drawing Sheets

(51) Int. Cl.
*H01L 27/088* (2006.01)
*H01L 27/12* (2006.01)

(56) References Cited

U.S. PATENT DOCUMENTS

2011/0291166 A1* 12/2011 Booth, Jr. ........ H01L 21/823821
257/296
2013/0023092 A1* 1/2013 Oda .................. H01L 21/02488
438/157
2013/0154006 A1 6/2013 Basker et al.
2013/0270655 A1* 10/2013 Adam ............... H01L 29/66545
257/410
2014/0117418 A1 5/2014 Flachowsky et al.
2014/0145242 A1 5/2014 Huang et al.
2015/0179767 A1* 6/2015 Wang ................ H01L 29/66795
257/347
2015/0206890 A1* 7/2015 Liaw .................. H01L 27/1104
257/391

* cited by examiner

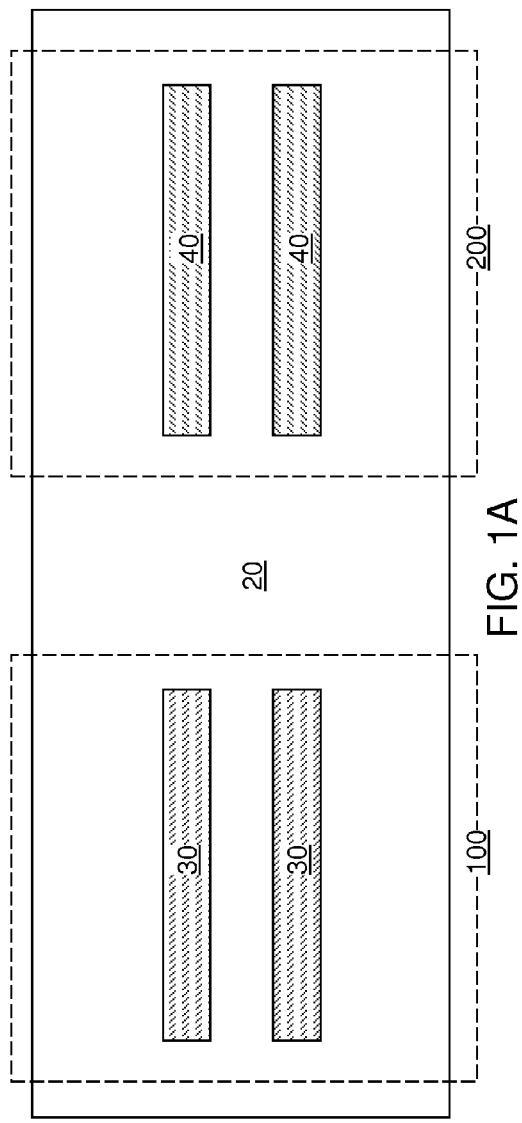
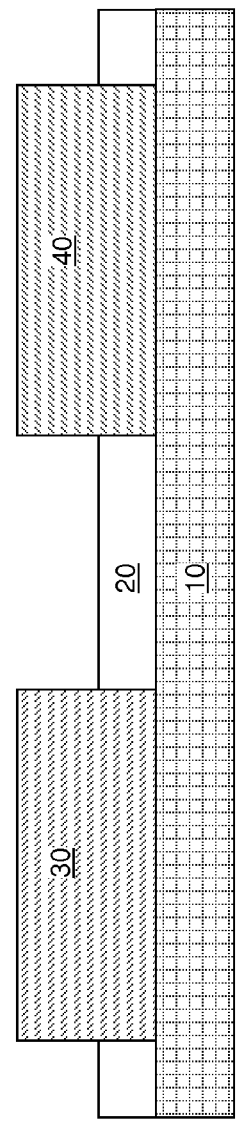
FIG. 1A
FIG. 1B

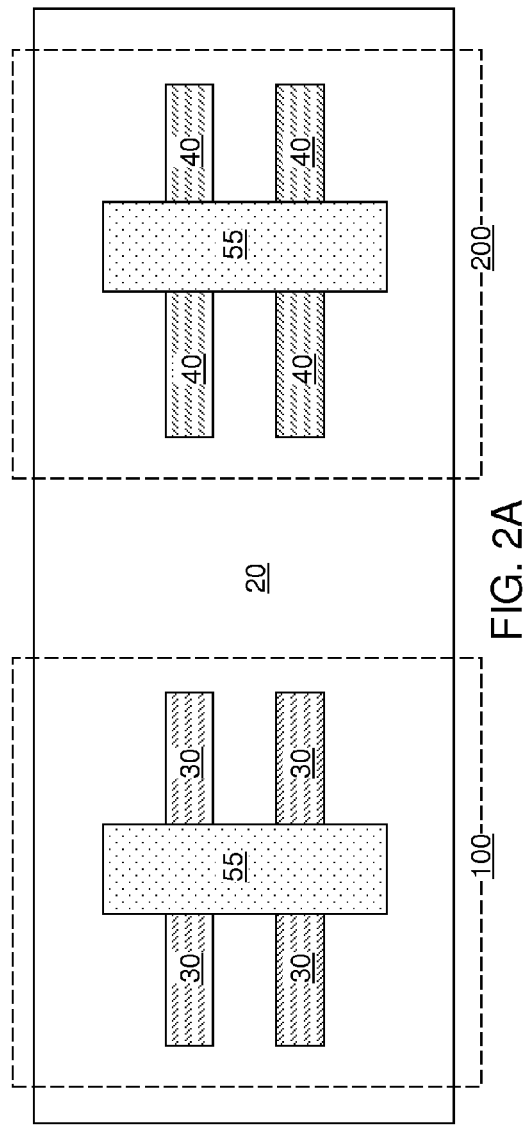
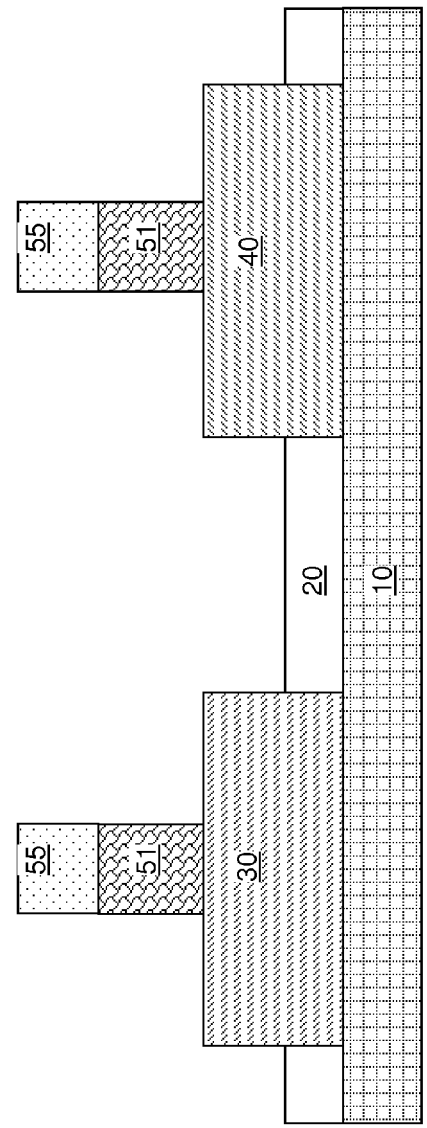

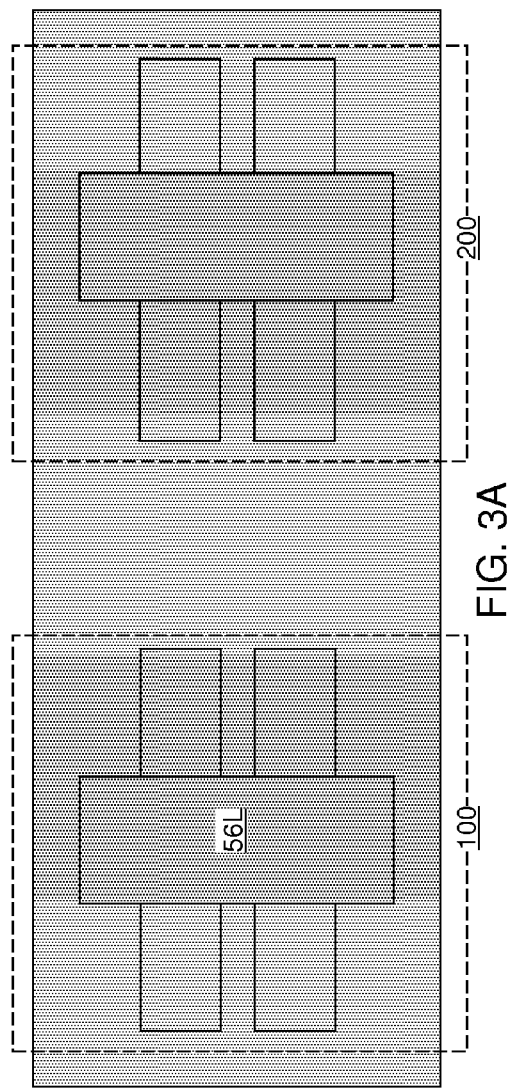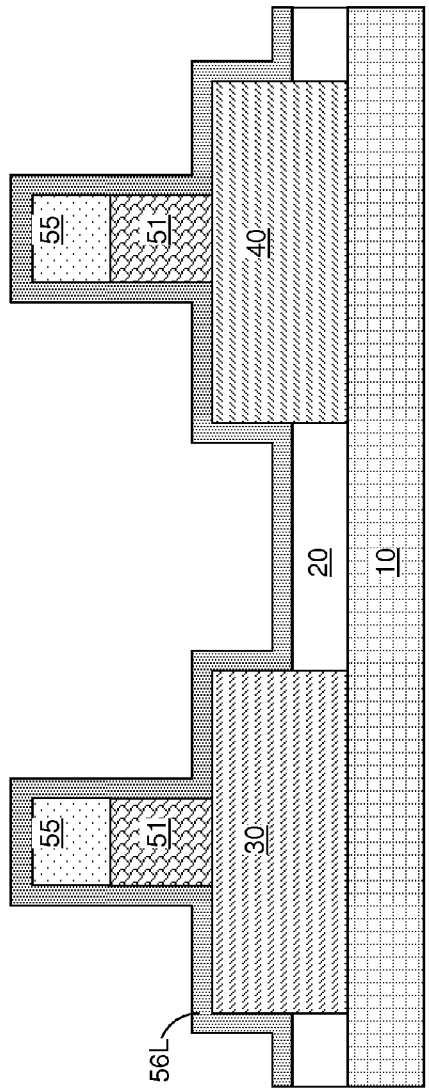

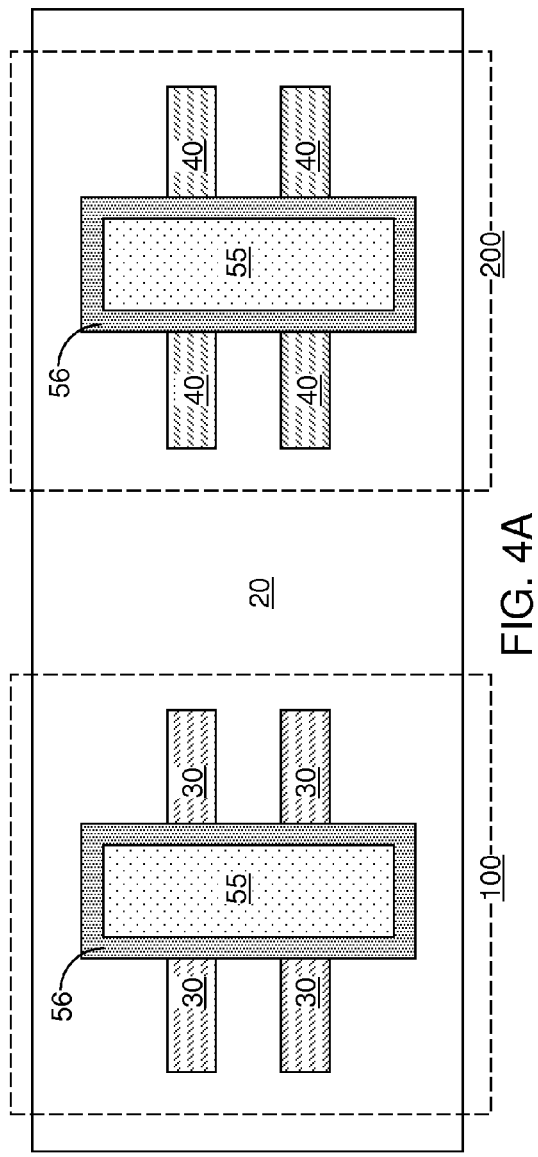
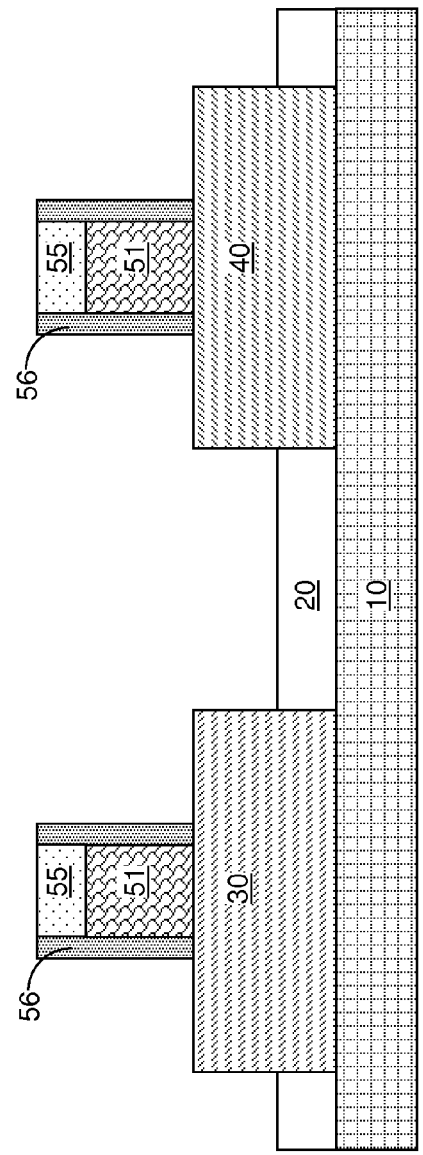
FIG. 4A
FIG. 4B

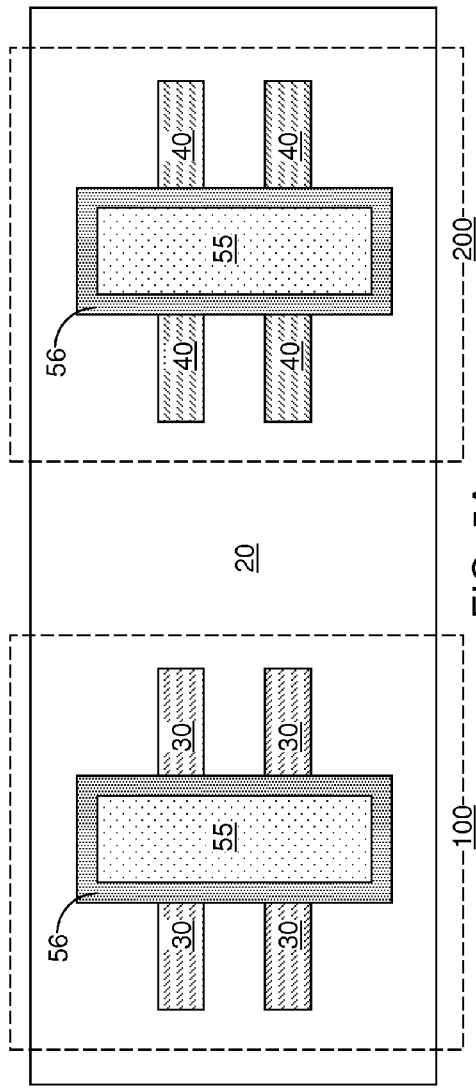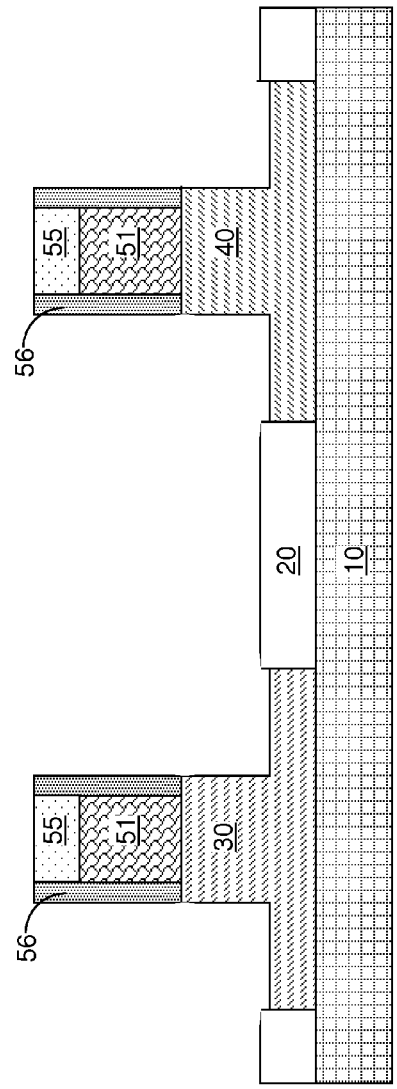

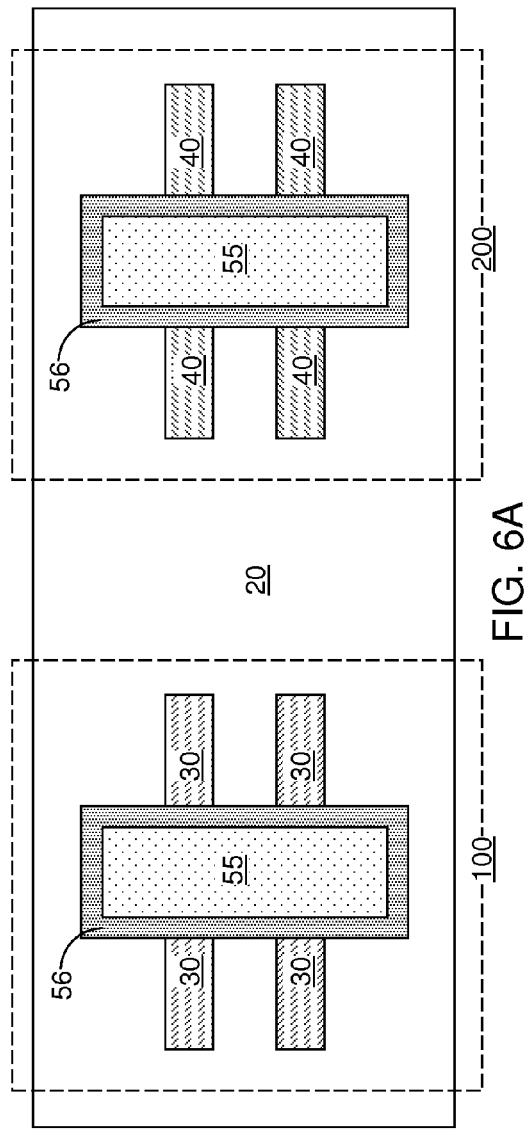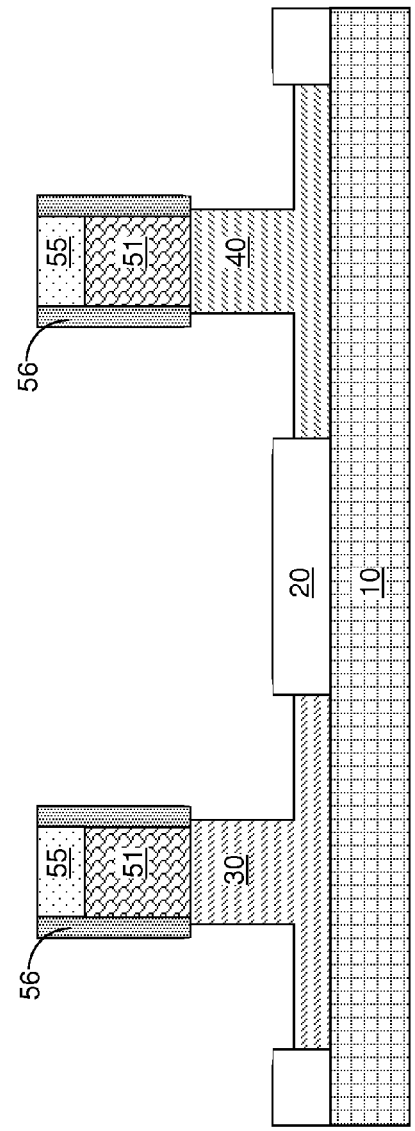

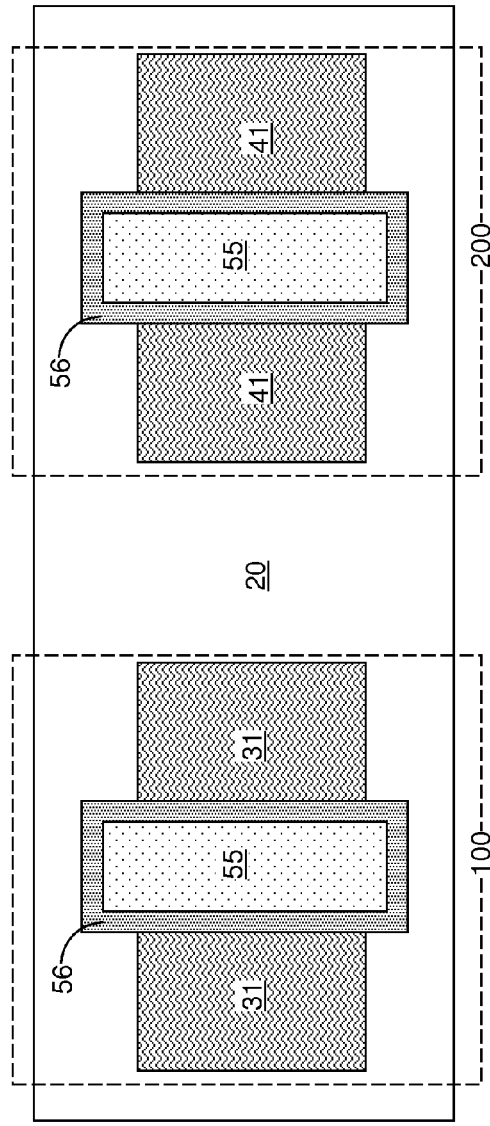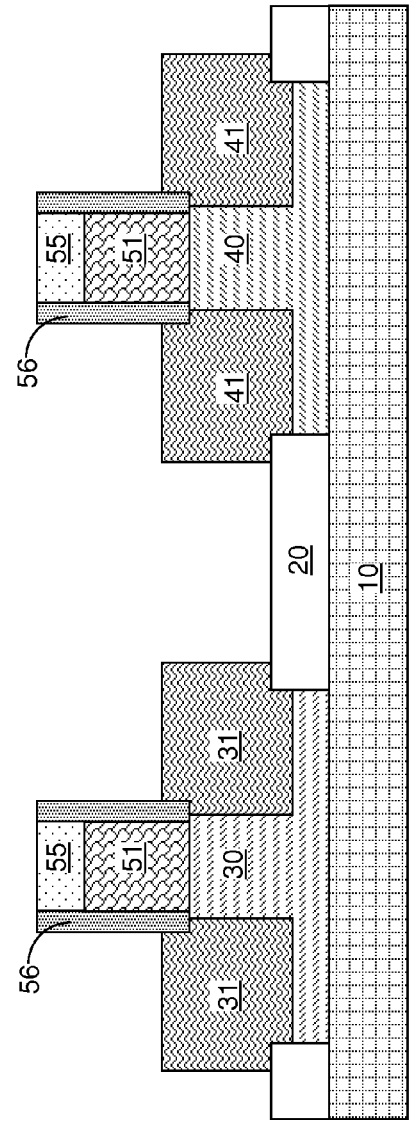

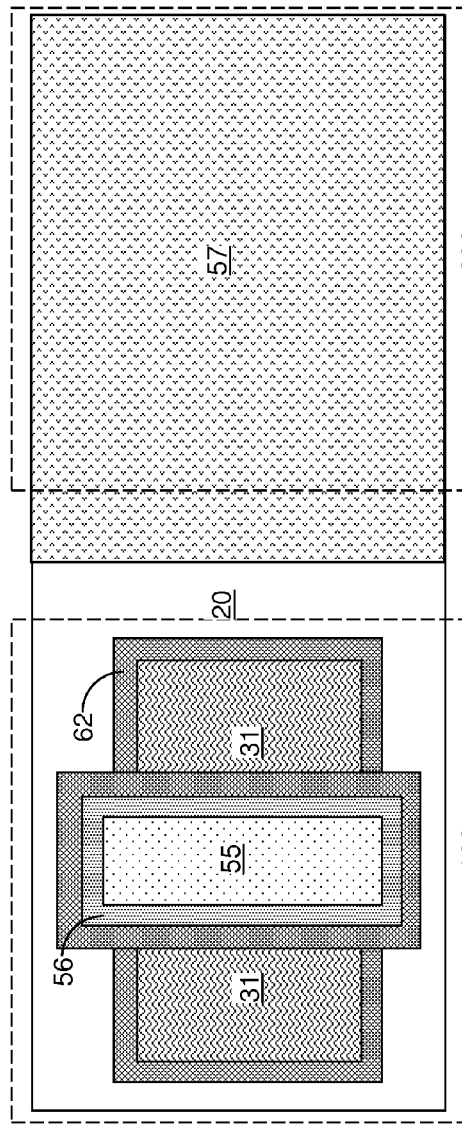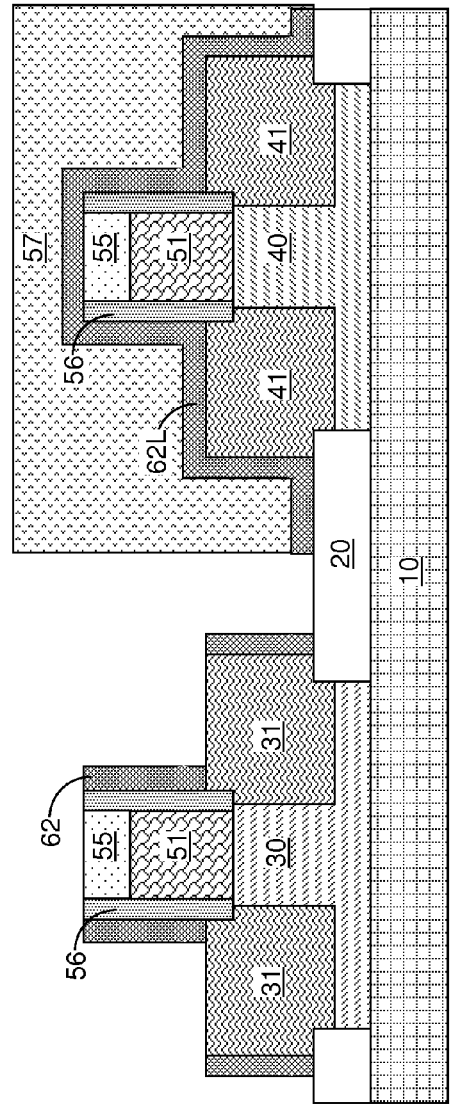
FIG. 9A
FIG. 9B

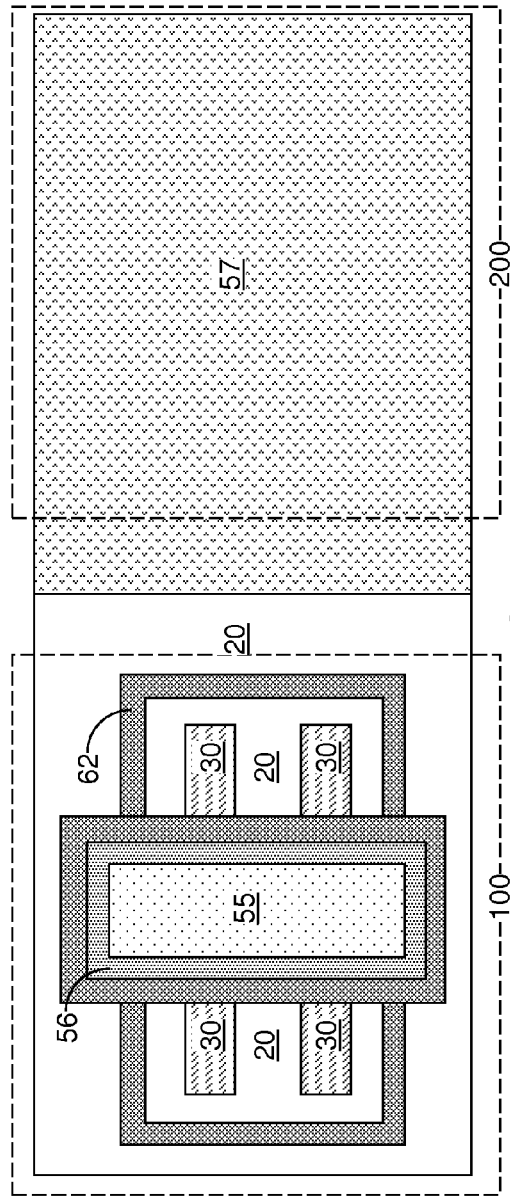
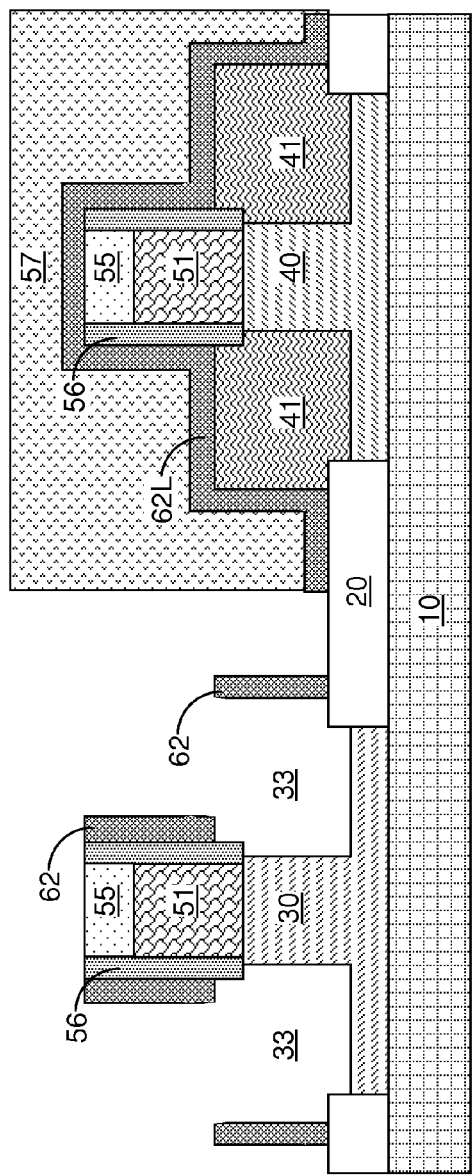
FIG. 10A
FIG. 10B

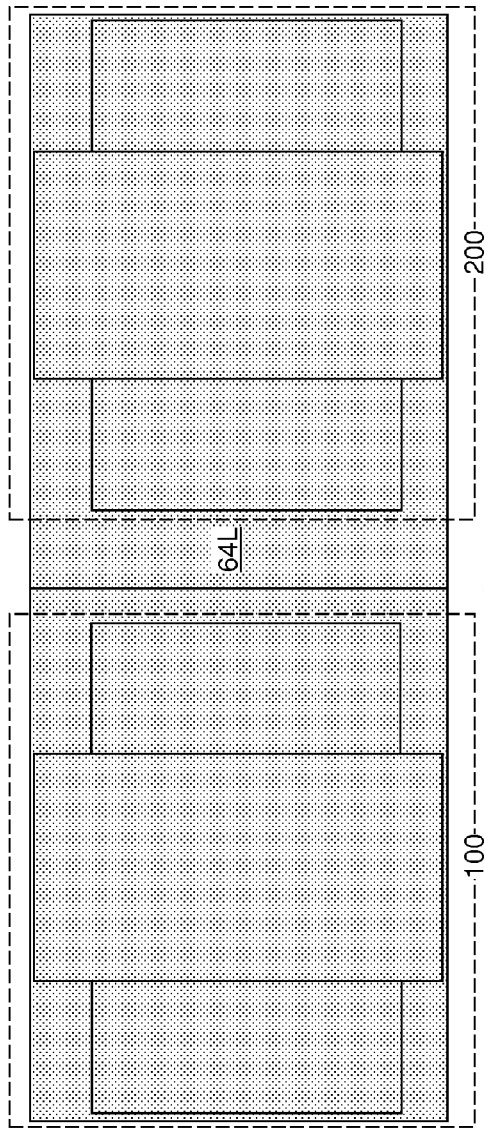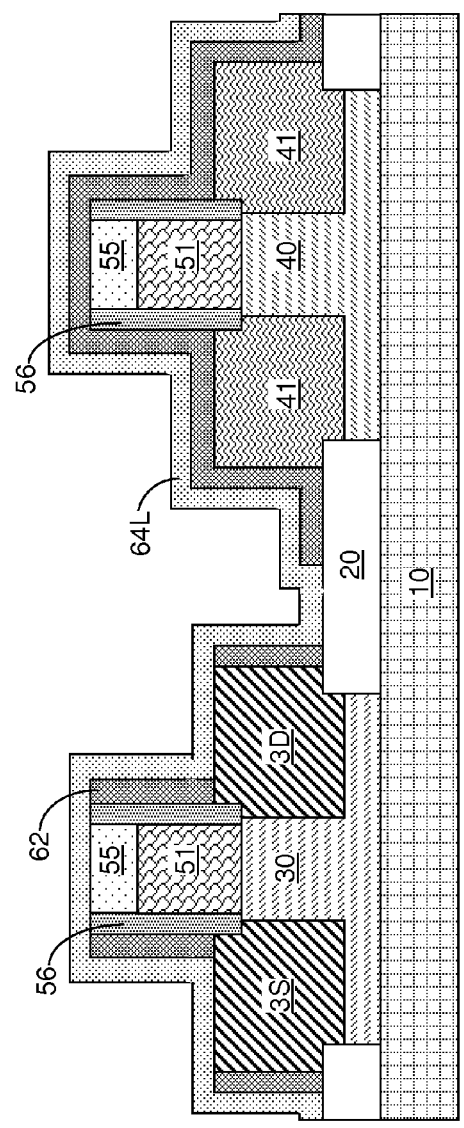

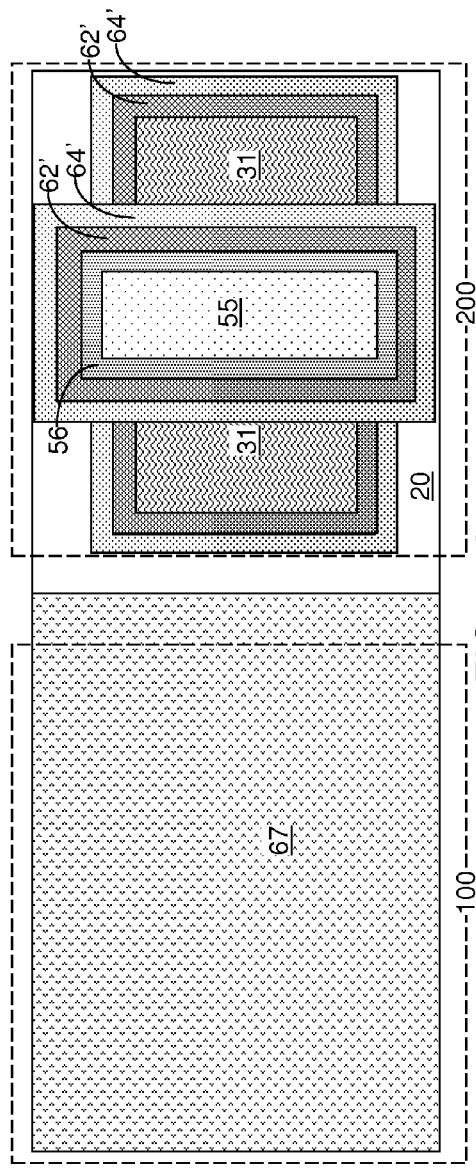
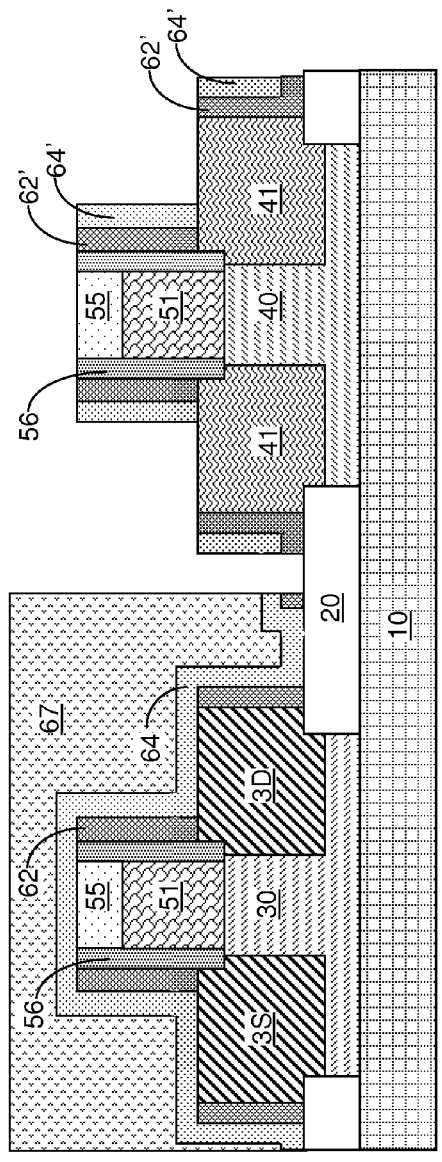
FIG. 13A
FIG. 13B

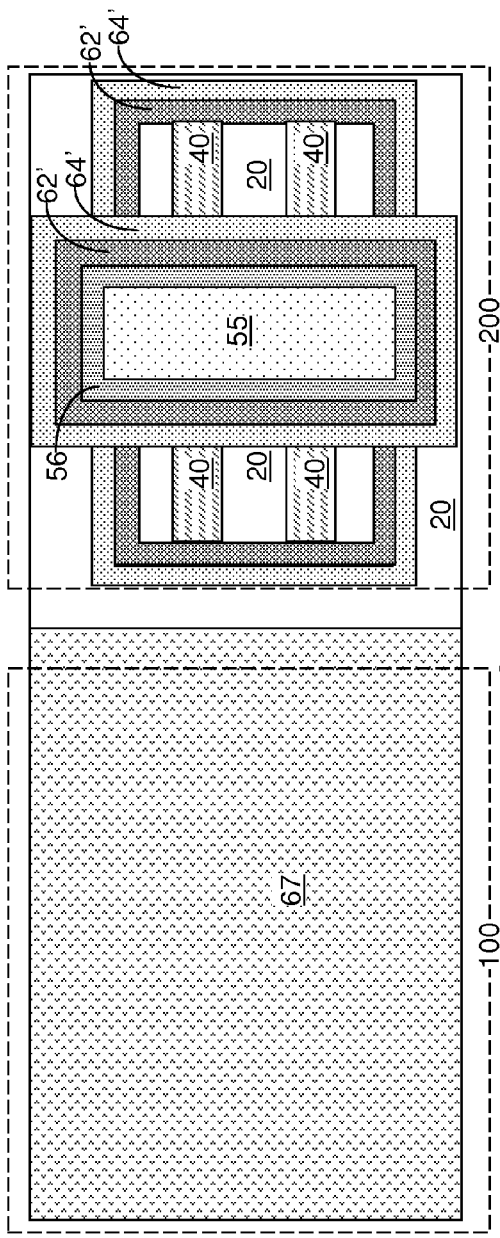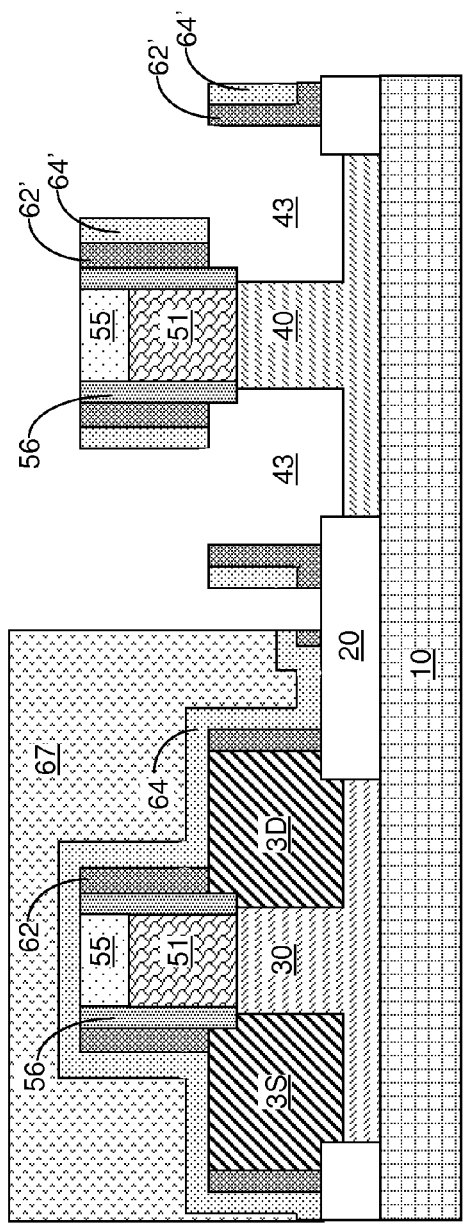
FIG. 14A
FIG. 14B

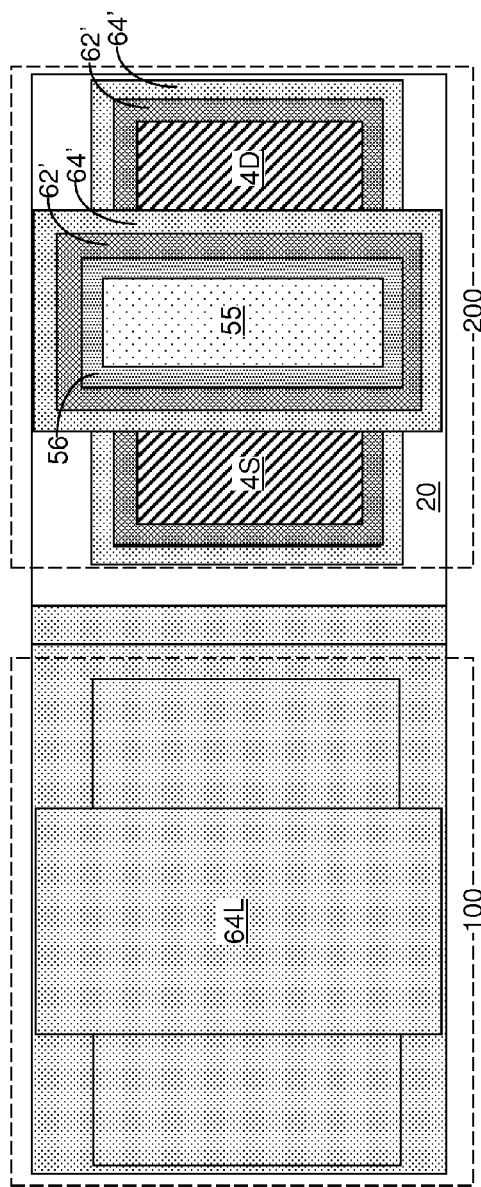
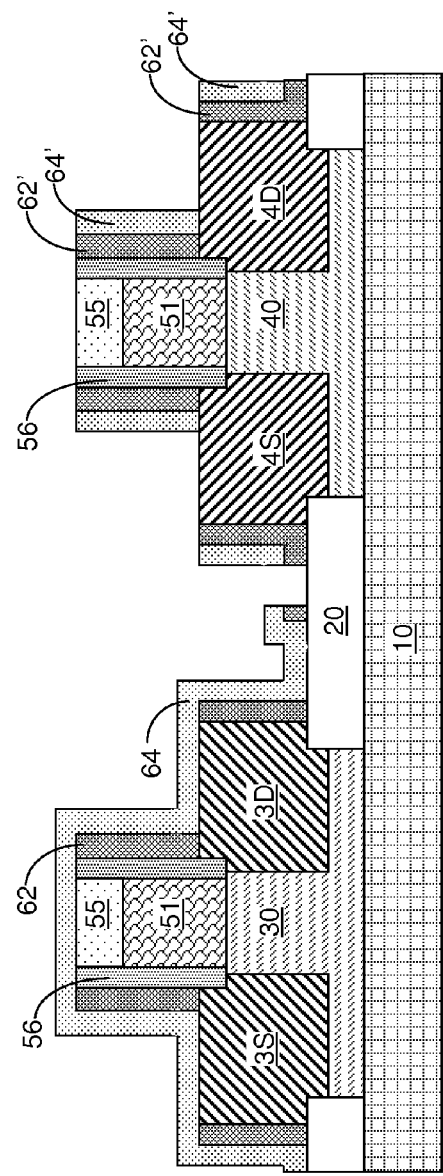
FIG. 15A
FIG. 15B

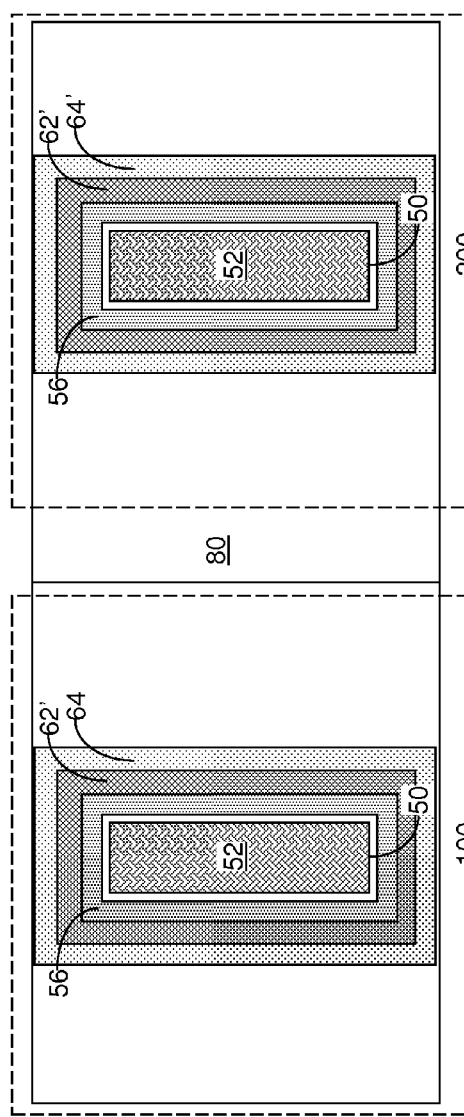
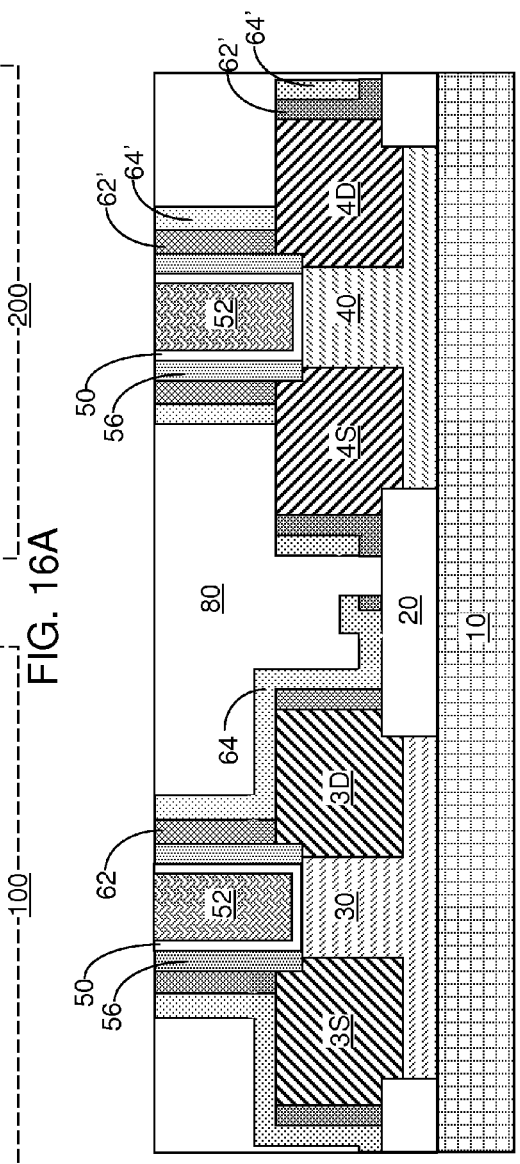
FIG. 16A
FIG. 16B

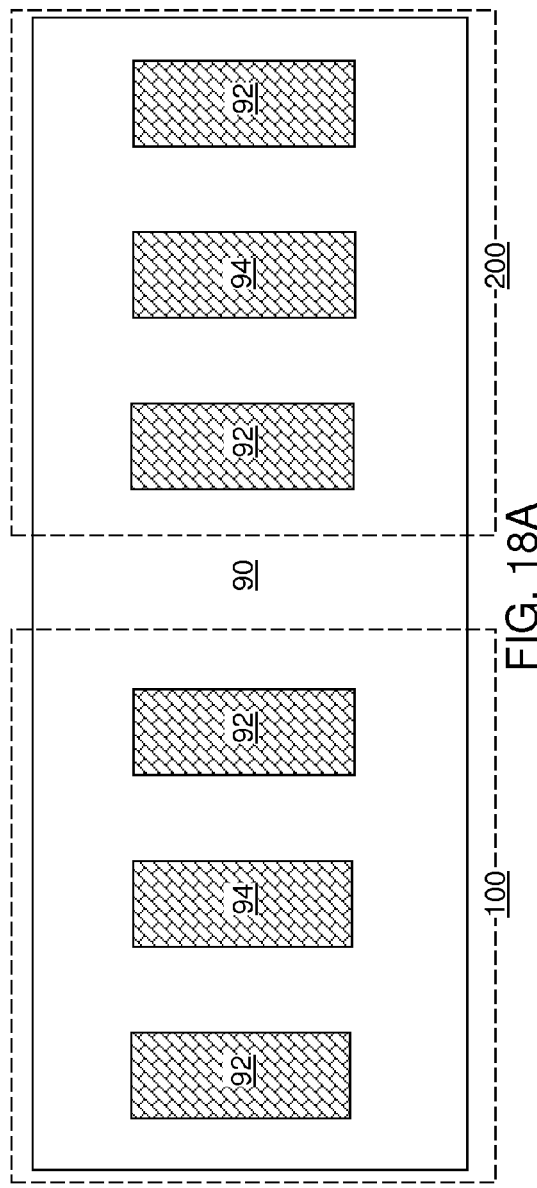
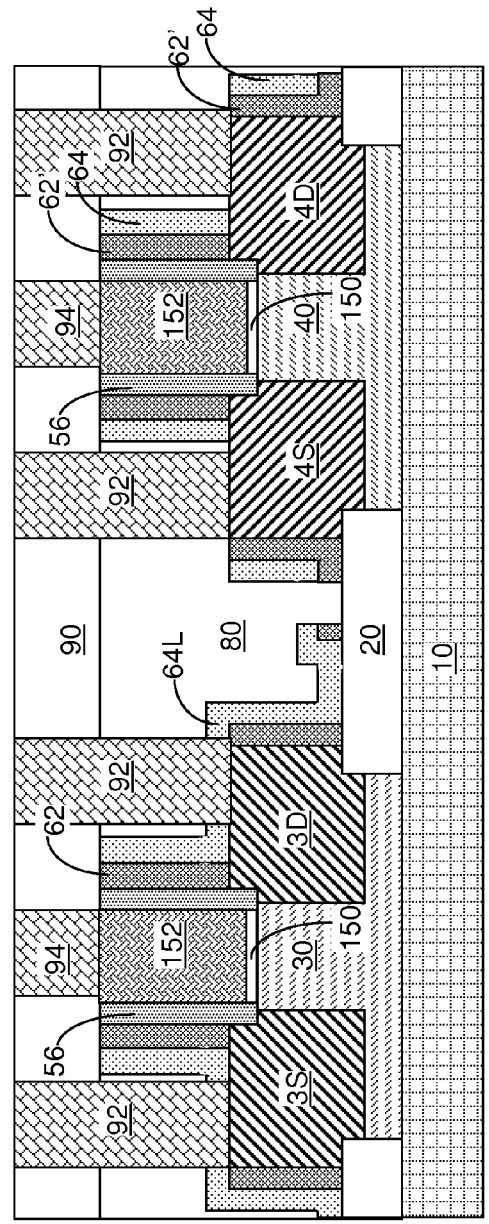
FIG. 18A
FIG. 18B

CMOS TRANSISTORS WITH IDENTICAL ACTIVE SEMICONDUCTOR REGION SHAPES

BACKGROUND

The present disclosure relates to semiconductor structures, and particularly to complementary metal oxide semiconductor (CMOS) field effect transistors (FETs) including identical active semiconductor region shapes and a method of manufacturing the same.

A CMOS circuit includes p-type transistors and n-type transistors. If a process integration scheme employing two separate epitaxial deposition processes are employed to form the active semiconductor regions of the p-type transistors and the active semiconductor regions of the n-type transistors, the two epitaxial deposition processes deposit different semiconductor materials that display different faceting characteristics. Thus, the two epitaxial deposition processes form active semiconductor regions having different faceting profiles. The inherent asymmetry in the faceting profiles of the active semiconductor regions for the two types of transistors results in different device parameters such as different parasitic capacitances between the gate electrode and the active semiconductor regions. Thus, p-type transistors and n-type transistors can have different shapes for active semiconductor regions and accompanying differences in other device parameters. In view of this, there exists a need to minimize the differences in the shapes of the active semiconductor regions and related device parameters across p-type transistors and n-type transistors in a CMOS circuit.

SUMMARY

A disposable semiconductor material is deposited to form disposable semiconductor material portions on semiconductor fins. A first dielectric liner is deposited and patterned to form openings above a first set of disposable semiconductor material portions on a first semiconductor fin, while a second set of disposable semiconductor material portions on a second semiconductor fin is covered with the first dielectric liner. The first set of disposable semiconductor material portions is replaced with a first set of active semiconductor regions by a combination of an etch and a selective epitaxy process that deposits a first semiconductor material. A second dielectric liner is deposited and patterned to form openings above the second set of disposable semiconductor material portions, while the first set of active semiconductor regions is covered with the second dielectric liner. The second set of disposable semiconductor material portions is replaced with a second set of active semiconductor regions employing another epitaxy process that deposits a second semiconductor material. The active semiconductor regions can have the same faceting profile irrespective of the semiconductor materials therein.

According to an aspect of the present disclosure, a method of forming a semiconductor structure is provided. A first semiconductor fin and a second semiconductor fin are formed on a substrate. First disposable semiconductor material portions are formed on portions of the first semiconductor fin and second disposable semiconductor material portions are formed on portions of the second semiconductor fin, respectively, by selective deposition of a disposable semiconductor material. The first disposable semiconductor material portions are replaced with first active semiconductor regions by a combination of a first etch process and a first selective epitaxy process, while the second disposable semiconductor material portions are present on the second semiconductor fin. The second disposable semiconductor material portions are replaced with second active semiconductor regions by a combination of a second etch process and a second selective epitaxy process.

According to another aspect of the present disclosure, a semiconductor structure includes a first fin field effect transistor and a second fin filed effect transistor located on a substrate, a first dielectric liner including a first dielectric material and laterally contacting a source region and a drain region of the first fin field effect transistor, another first dielectric liner including the first dielectric material and laterally contacting a source region and a drain region of the second fin field effect transistor, a second dielectric liner including a second dielectric material and contacting top surfaces of the source region and the drain region of the first fin field effect transistor, and another second dielectric liner including the second dielectric material and including a portion that has an L-shaped vertical cross-sectional shape and laterally surrounds the another first dielectric liner.

BRIEF DESCRIPTION OF SEVERAL VIEWS OF THE DRAWINGS

FIG. 1A is a top-down view of an exemplary semiconductor structure after formation of semiconductor fins and a shallow trench isolation layer on a substrate according to an embodiment of the present disclosure.

FIG. 1B is a vertical cross-sectional view of the exemplary semiconductor structure of FIG. 1A according to an embodiment of the present disclosure.

FIG. 2A is a top-down view of the exemplary semiconductor structure after formation of disposable gate structures according to an embodiment of the present disclosure.

FIG. 2B is a vertical cross-sectional view of the exemplary semiconductor structure FIG. 2A according to an embodiment of the present disclosure.

FIG. 3A is a top-down view of the exemplary semiconductor structure after formation of a gate spacer layer according to an embodiment of the present disclosure.

FIG. 3B is a vertical cross-sectional view of the exemplary semiconductor structure of FIG. 3A according to an embodiment of the present disclosure.

FIG. 4A is a top-down view of the exemplary semiconductor structure after formation of gate spacers according to an embodiment of the present disclosure.

FIG. 4B is a vertical cross-sectional view of the exemplary semiconductor structure of FIG. 4A according to an embodiment of the present disclosure.

FIG. 5A is a top-down view of the exemplary semiconductor structure recessing of physically exposed portions of semiconductor fins by an anisotropic etch according to an embodiment of the present disclosure.

FIG. 5B is a vertical cross-sectional view of the exemplary semiconductor structure of FIG. 5A according to an embodiment of the present disclosure.

FIG. 6A is a top-down view of the exemplary semiconductor structure after an optional isotropic etch according to an embodiment of the present disclosure.

FIG. 6B is a vertical cross-sectional view of the exemplary semiconductor structure of FIG. 6A according to an embodiment of the present disclosure.

FIG. 7A is a top-down view of the exemplary semiconductor structure after formation of disposable semiconductor material portions according to an embodiment of the present disclosure.

FIG. 7B is a vertical cross-sectional view of the exemplary semiconductor structure of FIG. 7A according to an embodiment of the present disclosure.

FIG. 9A is a top-down view of the exemplary semiconductor structure after an anisotropic etch that physically exposes top surfaces of first disposable semiconductor material portions according to an embodiment of the present disclosure.

FIG. 9B is a vertical cross-sectional view of the exemplary semiconductor structure of FIG. 9A according to an embodiment of the present disclosure.

FIG. 10A is a top-down view of the exemplary semiconductor structure after removal of the first disposable semiconductor material portions according to an embodiment of the present disclosure.

FIG. 10B is a vertical cross-sectional view of the exemplary semiconductor structure of FIG. 10A according to an embodiment of the present disclosure.

FIG. 12A is a top-down view of the exemplary semiconductor structure after formation of a second dielectric liner according to an embodiment of the present disclosure.

FIG. 12B is a vertical cross-sectional view of the exemplary semiconductor structure of FIG. 12A according to an embodiment of the present disclosure.

FIG. 13A is a top-down view of the exemplary semiconductor structure after an anisotropic etch that physically exposes top surfaces of second disposable semiconductor material portions according to an embodiment of the present disclosure.

FIG. 13B is a vertical cross-sectional view of the exemplary semiconductor structure of FIG. 13A according to an embodiment of the present disclosure.

FIG. 14A is a top-down view of the exemplary semiconductor structure after removal of the second disposable semiconductor material portions according to an embodiment of the present disclosure.

FIG. 14B is a vertical cross-sectional view of the exemplary semiconductor structure of FIG. 14A according to an embodiment of the present disclosure.

FIG. 15A is a top-down view of the exemplary semiconductor structure after formation of second active semiconductor regions by a second selective epitaxy process according to an embodiment of the present disclosure.

FIG. 15B is a vertical cross-sectional view of the exemplar semiconductor structure of FIG. 15A according to an embodiment of the present disclosure.

FIG. 16A is a top-down view of the exemplary semiconductor structure after formation of a planarization dielectric layer and replacement gate structures according to an embodiment of the present disclosure.

FIG. 16B is a vertical cross-sectional view of the exemplar semiconductor structure of FIG. 16A according to an embodiment of the present disclosure.

FIG. 18A is a top-down view of a variation of the exemplary semiconductor structure according to an embodiment of the present disclosure.

FIG. 18B is a vertical cross-sectional view of the exemplar semiconductor structure of FIG. 18A according to an embodiment of the present disclosure.

DETAILED DESCRIPTION

Figure 8A:
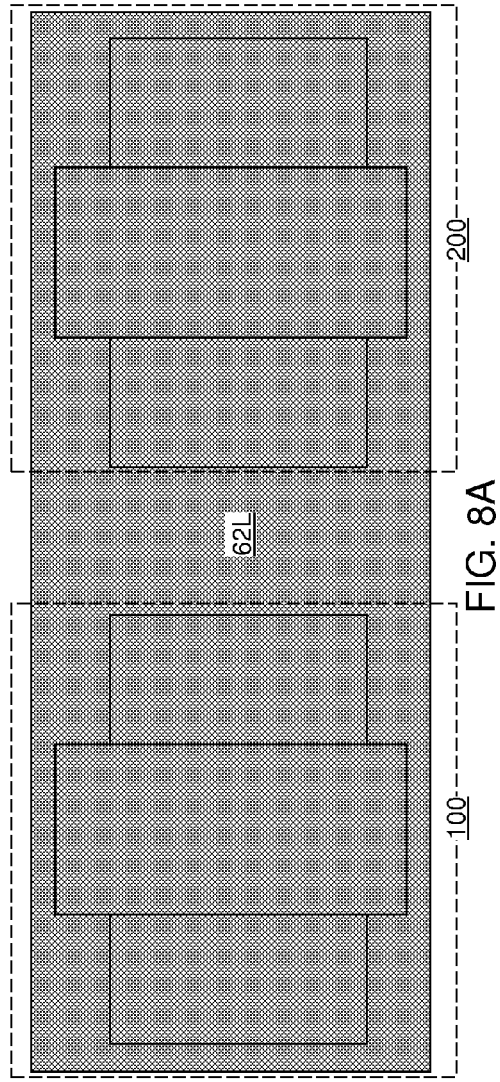
FIG. 8A is a top-down view of the exemplary semiconductor structure after formation of a first dielectric liner according to an embodiment of the present disclosure.

As stated above, the present disclosure relates to complementary metal oxide semiconductor (CMOS) field effect transistors (FETs) including identical active semiconductor region shapes and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Referring to FIGS. 1A and 1B, an exemplary semiconductor structure according to an embodiment of the present disclosure includes semiconductor fins (30, 40) formed on a top surface of a substrate 10. As used herein, a "semiconductor fin" refers to a semiconductor material portion having a pair of parallel sidewalls. The direction about which the moment of inertia of a semiconductor fin is at a minimum is herein referred to as a "lengthwise direction" of the semiconductor fin.

The semiconductor fins (30, 40) include at least one first semiconductor fin 30 formed in a first device region 100 and at least one second semiconductor fin 40 formed in a second device region 200. The at least one semiconductor fin 30 and the at least one second semiconductor fin 40 can have a same semiconductor material, or can have different semiconductor materials. In one embodiment, an upper portion of a bulk semiconductor substrate can be patterned employing a combination of lithographic methods and an anisotropic etch to provide the at least one first semiconductor fin 30 and at least one second semiconductor fin 40. The unpatterned portion of the bulk semiconductor substrate underlying the semiconductor fins (30, 40) can be a semiconductor material layer that constitutes the substrate 10. In another embodiment, the semiconductor fins (30, 40) can be formed by patterning a top semiconductor layer of a semiconductor-on-insulator substrate. In this case, a vertical stack including a handle substrate and a buried insulator layer can constitute the substrate 10.

Each of the semiconductor fins (30, 40) can include a single crystalline semiconductor material. The single crystalline semiconductor material can be, for example, silicon, germanium, silicon-germanium alloy, silicon carbon alloy, silicon-germanium-carbon alloy, gallium arsenide, indium arsenide, indium phosphide, other III-V compound semiconductor materials, II-VI compound semiconductor materials, organic semiconductor materials, and other compound semiconductor materials. In an exemplary case, the single crystalline semiconductor material can include single crystalline silicon or a single crystalline alloy of silicon.

In one embodiment, the semiconductor fins (30, 40) may, or may not, be doped with p-type dopants or n-type dopants.

The height of the semiconductor fins (30, 40) can be from 20 nm to 300 nm, although greater and lesser thicknesses can also be employed. The width of the semiconductor fins (30, 40) can be in a range from 3 nm to 100 nm, although lesser and greater widths can also be employed.

In one embodiment, all of the semiconductor fins (30, 40) can have the same height throughout. Top surfaces of the first semiconductor fins 30 and the second semiconductor fins 40 can be coplanar, i.e., located within a same horizontal plane. Further, bottom surfaces of the first semiconductor fins 30 and the second semiconductor fins 40 can be coplanar.

A shallow trench isolation layer 20 can be formed among the semiconductor fins (30, 40). The shallow trench isolation layer 20 is an insulator layer that includes a dielectric material such as silicon oxide. The shallow trench isolation layer 20 can be formed by depositing a dielectric material over the semiconductor fins (30, 40) and the substrate 10. The deposition of the dielectric material can be performed, for example, by chemical vapor deposition or spin coating. Excess portions of the deposited dielectric material can be removed from above the top surfaces of the semiconductor fins (30, 40), for example, by planarization (such as chemical mechanical planarization (CMP)). The shallow trench isolation layer 20 laterally surrounds bottom portions of semiconductor fins (30, 40). The top surface of the shallow trench isolation layer 20 is recessed with respect to the top surfaces of the semiconductor fins (30, 40).

Referring to FIGS. 2A and 2B, gate structures (51, 55) can be formed across the at least one first semiconductor fin 30 and across the at least one second semiconductor fin 40. Each gate structure (51, 55) can be a disposable gate structure that includes at least one disposable material, i.e., at least one material that are subsequently removed. For example, each gate structure (51, 55) can include a lower disposable gate material portion 51 and an upper disposable gate material portion 55. In an illustrative example, the lower disposable gate material portions 51 can include germanium or a germanium-containing alloy that can be removed selective to the semiconductor materials of the semiconductor fins (30, 40), and the upper disposable gate material portions 55 can include silicon oxide. The gate structures (51, 55) can be formed by deposition of disposable material layers, application and lithographic patterning of a photoresist layer above the disposable material layers, and transfer of the pattern in the patterned photoresist layer through the disposable material layers by an anisotropic etch such as a reactive ion etch. The remaining portions of the disposable material layers constitute the gate structures (51, 55). The patterned photoresist layer can be removed, for example, by ashing. In one embodiment, a first gate structure (51, 55) and a second gate structure (51, 55) can be formed across the at least one first semiconductor fin 30 and across the at least one second semiconductor fin 40, respectively.

Referring to FIGS. 3A and 3B, a gate spacer layer 56L can be formed on the top surfaces and sidewalls of the gate structures (51, 55) and the semiconductor fins (30, 40) by a conformal deposition of a dielectric material. The gate spacer layer 56L can be formed, for example, by low pressure chemical vapor deposition (LPCVD), atomic layer deposition (ALD), or any other conformal deposition method for depositing a dielectric material as known in the art. In one embodiment, the gate spacer layer 56L can include silicon nitride. The dielectric material of the gate spacer layer 56L can be silicon oxide, silicon nitride, silicon oxynitride, organosilicate glass, a dielectric metal oxide, a dielectric metal nitride, or a combination thereof. The thickness of the gate spacer layer 56L can be in a range from 3 nm to 60 nm, although lesser and greater thicknesses can also be employed.

Referring to FIGS. 4A and 4B, an anisotropic etch is performed to remove horizontal portions of the gate spacer layer 56L. The anisotropic etch can be selective to the semiconductor material of the semiconductor fins (30, 40). The anisotropic etch is extended further after removal of horizontal portions of the gate spacer layer 56L so that all vertical portions of the gate spacer layer 56L is removed from the sidewalls of the semiconductor fins (30, 40). Vertical portions of the gate spacer layer 56L located on the gate structures (51, 55) can be recessed during the removal of the portions of the gate spacer layer 56L from the sidewalls of the semiconductor fins (30, 40). The upper disposable gate material portions 55 can be collaterally recessed during the anisotropic etch. After the anisotropic etch, each remaining portion of the gate spacer layer 56L constitutes a gate spacer 56 that laterally surrounds the sidewalls of the gate structures (51, 55). In one embodiment, the entirety of sidewall surfaces of each gate structures (51, 55) can contact inner sidewalls of a gate spacer 56.

Referring to FIGS. 5A and 5B, physically exposed portions of semiconductor fins (30, 40) can be recessed. In one embodiment, the combination of the first and second gate structures (51, 55) in the first and second device regions (100, 200) and the gate spacers 56 can be employed as an etch mask during the anisotropic etch. The chemistry of the anisotropic etch can be selective to the dielectric materials of the shallow trench isolation layer 20, the gate spacers 56, and the upper disposable gate material portions 55. The anisotropic etch can be a reactive ion etch that removes the semiconductor materials of the semiconductor fins (30, 40) selective to the shallow trench isolation layer 20, the gate spacers 56, and the upper disposable gate material portions 55. In one embodiment, newly formed sidewalls of each semiconductor fin (30, 40) can be vertically coincident with the outer sidewalls of an overlying gate spacer 56. As used herein, two surfaces are vertically coincident with each other if there exists a vertical two-dimensional plane that includes the two surfaces. The recessed top surfaces of the semiconductor fins (30, 40) can be located below, at, or above the top surface of the shallow trench isolation layer.

Referring to FIGS. 6A and 6B, an optional isotropic etch may be performed to laterally recess the sidewalls of the semiconductor fins (30, 40) and further recess the recessed top surfaces of the semiconductor fins (30, 40). The isotropic etch, if employed, can be a wet etch or a dry etch.

Referring to FIGS. 7A and 7B, disposable semiconductor material portions (31, 41) can be formed by a selective deposition of a disposable semiconductor material. As used herein, a "selective deposition" refers to a deposition process in which a material is deposited on one type of surfaces while not being deposited on another type of surfaces. During the selective deposition of the disposable semiconductor material, the disposable semiconductor material is deposited on, and grows from, semiconductor surfaces, while the disposable semiconductor material does not grow from dielectric surfaces. As used herein, a disposable semiconductor material is a semiconductor material that is subsequently removed.

The disposable semiconductor material portions (31, 41) include first disposable semiconductor material portions 31 that are deposited on portions of the at least one first semiconductor fin 30, and second disposable semiconductor material portions 41 that are deposited on portions of the at least one second semiconductor fin 40, respectively. The selective deposition process that deposits the disposable semiconductor material can deposit the disposable semiconductor material portions (31, 41) as polycrystalline semiconductor material portions or as single crystalline semiconductor material portions. In one embodiment, the selective deposition of the disposable semiconductor material can be performed by a selective epitaxy process that deposits single crystalline disposable semiconductor material portions.

The disposable semiconductor material in the disposable semiconductor material portions (31, 41) is a semiconductor material that can be removed selective to the semiconductor materials of the semiconductor fins (30, 40). In one embodiment, the disposable semiconductor material portions (31, 41) can include germanium or a silicon germanium alloy having a greater concentration of germanium in atomic percentage than the semiconductor materials of semiconductor fins (30, 40), and the semiconductor fins (30, 40) can include silicon or a silicon germanium alloy having a lesser concentration of germanium in atomic percentage than the disposable semiconductor material.

The growth of the disposable semiconductor material portions (31, 41) can proceed with, or without, crystallographically faceted surfaces depending on the deposited disposable semiconductor material and the deposition conditions. Because the first disposable semiconductor material portions 31 and the second disposable semiconductor material portions 41 are formed simultaneously under the same deposition condition, the first disposable semiconductor material portions 31 and the second disposable semiconductor material portions 41 can be formed with identical faceting characteristics. Thus, if the first disposable semiconductor material portions 31 do not include faceted surfaces, the second disposable semiconductor material portions 41 do not include faceted surfaces. If the first disposable semiconductor material portions 31 include faceted surfaces, the second disposable semiconductor material portions 41 can include identical types of faceted surfaces.

In one embodiment, the selective epitaxy process can proceed until at least one first disposable semiconductor material portion 31 a plurality of first semiconductor fins 30 and/or at least one second disposable semiconductor material portion 41 contacts a plurality of second semiconductor fins 40.

Figure 8B:
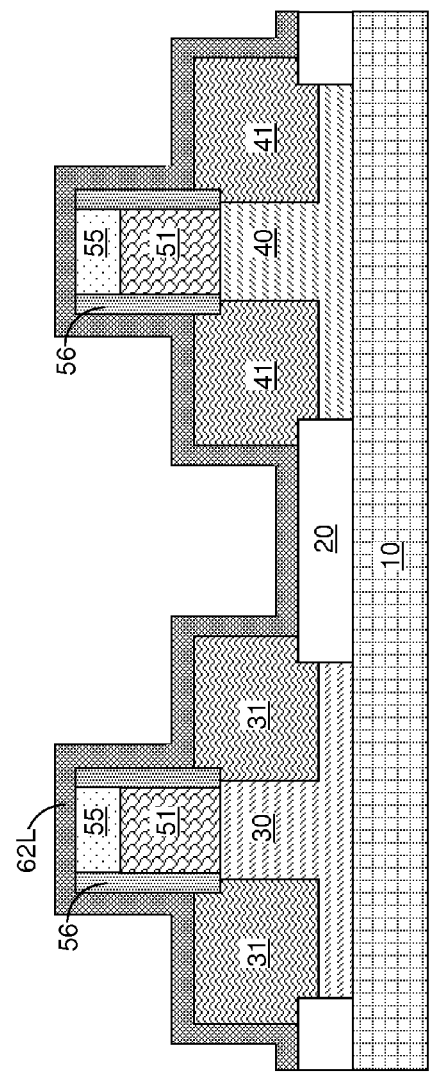
FIG. 8B is a vertical cross-sectional view of the exemplary semiconductor structure of FIG. 8A according to an embodiment of the present disclosure.

Referring to FIGS. 8A and 8B, a first contiguous dielectric liner 62L can be formed directly on the surfaces of the first and second disposable semiconductor material portions (31, 41). The first contiguous dielectric liner 62L is a first dielectric liner that contiguously extends through horizontal portions and vertical portions thereof, and laterally surrounds each of the first and second disposable semiconductor material portions (31, 41). The first contiguous dielectric liner 62L includes a dielectric material such as silicon nitride, silicon oxide, a dielectric metal oxide, or a dielectric metal nitride. In one embodiment, the first contiguous dielectric liner 62L can include silicon nitride. The first contiguous dielectric liner 62L can be deposited by a conformal deposition method such as low pressure chemical vapor deposition (LPCVD) or atomic layer deposition (ALD). The thickness of the first contiguous dielectric liner 62L can be in a range from 2 nm to 20 nm, although lesser and greater thicknesses can also be employed.

Referring to FIGS. 9A and 9B, a first mask layer 57 is formed over the first contiguous dielectric liner 62L in the second device region 200, while the first mask layer 57 does not cover the portion of the first dielectric material layer 62L in the first device region 100. In one embodiment, the first mask layer 57 can be a patterned photoresist layer, which can be formed by application and lithographic patterning of a photoresist layer.

An anisotropic etch can be performed to remove horizontal portions of the first contiguous dielectric liner 62L from above the first disposable semiconductor material portions 31, while the portion of the first contiguous dielectric liner 62L overlying the second disposable semiconductor material portions 41 is masked by the first mask layer 57. The anisotropic etch physically exposes top surfaces of the first disposable semiconductor material portions 31. The remaining portions of the first contiguous dielectric liner 62L in the first device region 100 contact, and laterally surround, sidewalls of the first disposable semiconductor material portions 31. The remaining portion of the first contiguous dielectric liner 62L in the first device region 100 is a single contiguous structure, and is herein referred to as a first-device first dielectric liner 62. The first-device first dielectric liner 62 is a first dielectric liner that remains in the first device region 100.

Subsequently, the first disposable semiconductor material portions 31 can be replaced with first active semiconductor regions that function as active semiconductor regions of a fin field effect transistor. As used herein, "active semiconductor regions" collectively refer to source regions and drain regions of a field effect transistor. The replacement of the first disposable semiconductor material portions 31 with first active semiconductor regions can be performed by a combination of a first etch process and a first selective epitaxy process, while the second disposable semiconductor material portions 41 are present on the at least one second semiconductor fin 40.

Referring to FIGS. 10A and 10B, the first disposable semiconductor material portions 31 are removed selective to the first-device first dielectric liner 62 (which includes vertical portions of the original first contiguous dielectric liner 62L in the first device region 100) and the at least one first semiconductor fin 30. For example, if the first disposable semiconductor material portions 31 include germanium or a germanium-including semiconductor alloy and if the at least one first semiconductor fin 30 includes silicon, the first disposable semiconductor material portions 31 can be removed by a wet etch employing a mixture of hydrogen peroxide and hydrofluoric acid.

A pair of first cavities 33 can be formed in volumes from which the first disposable semiconductor material portions 31 are removed. Each first cavity 31 formed upon removal of the first disposable semiconductor material portions 31 is laterally enclosed by sidewalls of the vertical portions of the first-device first dielectric liner 62 and one or more sidewalls of the at least one first semiconductor fin 30. The first mask layer 57 can be subsequently removed, for example, by ashing.

Figure 11A:
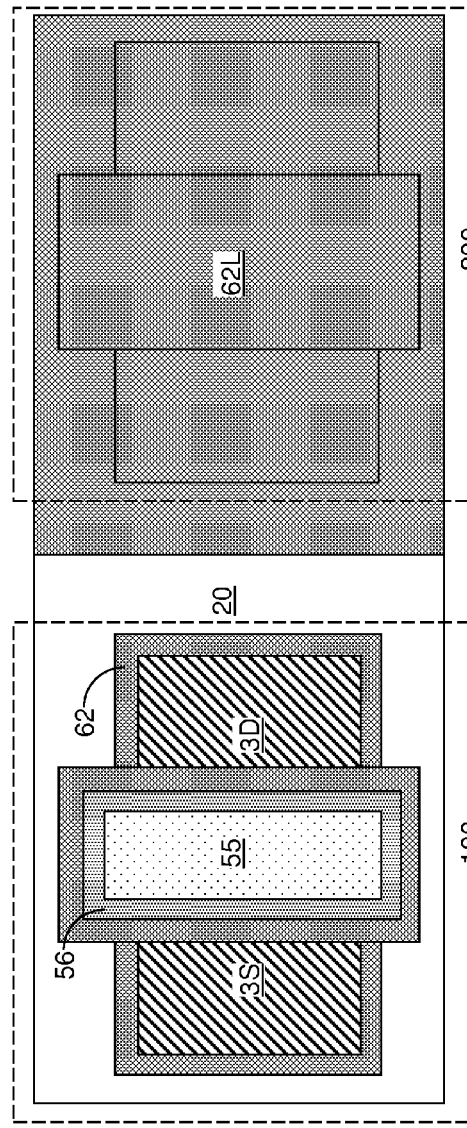
FIG. 11A is a top-down view of the exemplary semiconductor structure after formation of first active semiconductor regions by a first selective epitaxy process according to an embodiment of the present disclosure.
Figure 11B:
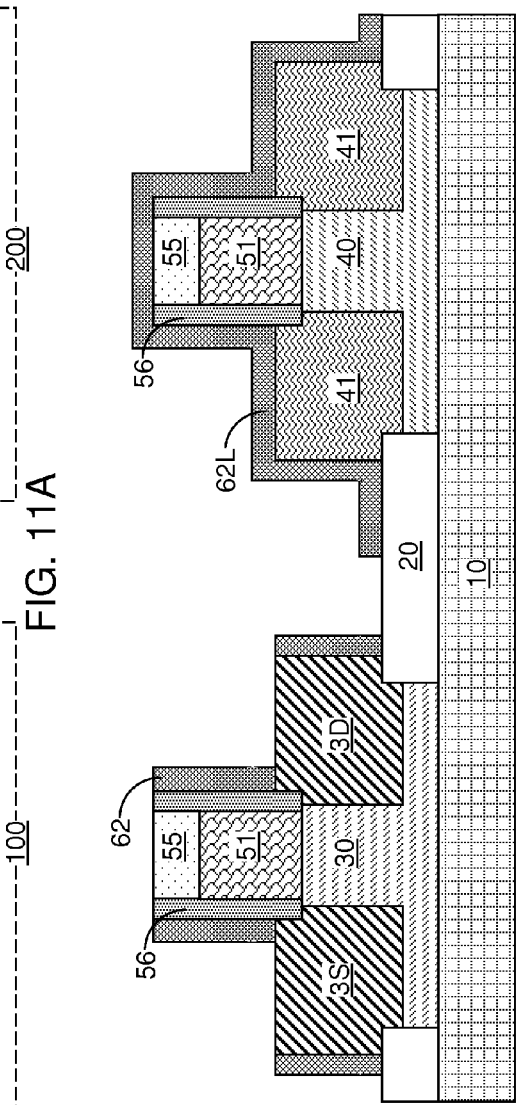
FIG. 11B is a vertical cross-sectional view of the exemplar semiconductor structure of FIG. 11A according to an embodiment of the present disclosure.

Referring to FIGS. 11A and 11B, first active semiconductor regions (3S, 3D) can be formed by a first selective deposition process, while the second disposable semiconductor material portions 41 are present on the at least one second semiconductor fin 40. The first active semiconductor regions (3S, 3D) can be formed on physically exposed semiconductor surfaces of the at least one first semiconductor fin 30 by selective deposition of a semiconductor material. During the first selective deposition process, the deposited semiconductor material forms the first active semiconductor regions (3S, 3D) within the first cavities 33, while the first contiguous dielectric liner 62L prevents deposition of any semiconductor material in the second device region 200. The first active semiconductor regions (3S, 3D) can include a first source region 3S and a first drain region 3D.

In one embodiment, the first selective deposition process can be a first selective epitaxy process. During the first selective epitaxy process, the deposited semiconductor material grows from physically exposed semiconductor surfaces, which include sidewall surfaces and recessed horizontal surfaces of the at least one first semiconductor fin 30. The semiconductor material does not grow from dielectric surfaces such as the surfaces of the first contiguous dielectric liner 62L and the shallow trench isolation layer 20.

In one embodiment, the first active semiconductor regions (3S, 3D) can be epitaxially aligned to the single crystalline structure of the at least one first semiconductor fin 30. The first active semiconductor regions (3S, 3D) can include the same semiconductor material as, or a semiconductor material different from, the semiconductor material of the at least one first semiconductor fin 30. In one embodiment, the at least one first semiconductor fin 30 can include silicon, and the first active semiconductor regions (3S, 3D) can include a doped silicon germanium alloy or a doped silicon carbon alloy.

The lateral extent of the first active semiconductor regions (3S, 3D) is confined by the first-device first dielectric liner 62. Thus, the horizontal cross-sectional shapes of the first active semiconductor regions (3S, 3D) can be identical to the horizontal cross-sectional shapes of the first disposable semiconductor material portions 31.

In one embodiment, the first active semiconductor regions (3S, 3D) can be formed with in-situ doping during the first selective epitaxy process. Thus, the first active semiconductor regions (3S, 3D) can be formed as doped semiconductor material portions with epitaxial alignment to the at least one first semiconductor fin 30. Alternatively, the first active semiconductor regions (3S, 3D) can be formed by ex-situ doping. In this case, the first active semiconductor regions (3S, 3D) can be formed as intrinsic semiconductor material portions with epitaxial alignment to the at least one first semiconductor fin 30, and electrical dopants can be subsequently introduced into the first active semiconductor regions (3S, 3D) to convert the first active semiconductor regions (3S, 3D) into doped semiconductor material portions.

After formation of the first active semiconductor regions (3S, 3D), the at least one first semiconductor fin 30 constitutes at least one body region of a field effect transistor. A p-n junction can be formed at the interfaces between each adjoining pair of at least one first semiconductor fin 30 and the first active semiconductor regions (3S, 3D).

Referring to FIGS. 12A and 12B, a second contiguous dielectric liner 64L can be formed directly on the first active semiconductor regions (3S, 3D) and directly on the first-device first dielectric liner 62 and the first contiguous dielectric liner 62L (which are remaining portions of the first contiguous dielectric liner 62L illustrated in FIGS. 8A and 8B). The second contiguous dielectric liner 64L is a second dielectric liner that contiguously extends through horizontal portions and vertical portions thereof. The second contiguous dielectric liner 64L includes a dielectric material such as silicon nitride, silicon oxide, a dielectric metal oxide, or a dielectric metal nitride. The second contiguous dielectric liner 64L can have the same composition as, or can have a different composition from, the first contiguous dielectric liner 62L. In one embodiment, the second contiguous dielectric liner 64L can include silicon nitride. The second contiguous dielectric liner 64L can be deposited by a conformal deposition method such as low pressure chemical vapor deposition (LPCVD) or atomic layer deposition (ALD). The thickness of the second contiguous dielectric liner 64L can be in a range from 2 nm to 20 nm, although lesser and greater thicknesses can also be employed.

Referring to FIGS. 13A and 13B, a second mask layer 67 is formed over the second contiguous dielectric liner 64L in the first device region 100, while the second mask layer 67 does not cover the portion of the second dielectric material layer 64L in the second device region 200. In one embodiment, the second mask layer 67 can be a patterned photoresist layer, which can be formed by application and lithographic patterning of a photoresist layer.

An anisotropic etch can be performed to remove horizontal portions of the second contiguous dielectric liner 64L and horizontal portions of the first contiguous dielectric liner 62L from above the second disposable semiconductor material portions 41, while the portion of the second contiguous dielectric liner 64L overlying the first active semiconductor regions (3S, 3D) is masked by the second mask layer 67. The anisotropic etch physically exposes top surfaces of the second disposable semiconductor material portions 41.

The remaining portions of the first contiguous dielectric liner 62L in the second device region 200 contact, and laterally surround, sidewalls of the second disposable semiconductor material portions 41, and are herein collectively referred to as a second-device first dielectric liner 62'. The second-device first dielectric liner 62' is a first dielectric liner that remains in the second device region 200.

The remaining portions of the second contiguous dielectric liner 64L in the second device region 200 laterally surround the second-device first dielectric liner 62' and the second disposable semiconductor material portions 41. The remaining portions of the second contiguous dielectric liner 64L in the second device region 200 constitute a single contiguous structure, and are herein collectively referred to as a second-device second dielectric liner 64'. The second-device second dielectric liner 64' is a second dielectric liner that remains in the second device region 200.

The remaining portions of the second contiguous dielectric liner 64L in the first device region 100 laterally surround the first-device first dielectric liner 62 and the first active semiconductor regions (3S, 3D). The remaining portions of the second contiguous dielectric liner 64L in the first device region 100 constitute a single contiguous structure, and are herein collectively referred to as a first-device second dielectric liner 64. The first-device second dielectric liner 64 is a second dielectric liner that remains in the first device region 100.

The first-device first dielectric liner 62 and the second-device first dielectric liner 62' have the same thickness and the same composition. The first-device second dielectric liner 64 and the second-device second dielectric liner 64' have the same thickness and the same composition.

The second-device second dielectric liner 64' includes a portion that has an L-shaped vertical cross-sectional shape and laterally surrounds the second device first dielectric liner 62. The L-shaped vertical cross-sectional shape can have a lateral width that is the same as the sum of the thickness of the first dielectric liners (62, 62') and the thickness of the second dielectric liners (64, 64'). In one embodiment, the outermost sidewalls of the second-device second dielectric liner 64' are vertically coincident with outer sidewalls of the second-device first dielectric liner 62'.

Subsequently, the second disposable semiconductor material portions 41 can be replaced with second active semiconductor regions that function as active semiconductor regions of another fin field effect transistor. The replacement of the second disposable semiconductor material portions 41 with second active semiconductor regions can be performed by a combination of a second etch process and a second selective epitaxy process, while first active semiconductor regions (3S, 3D) are present on the at least one first semiconductor fin 30.

Referring to FIGS. 14A and 14B, the second disposable semiconductor material portions 41 are removed selective to the second-device first dielectric liner 62' and the second-device second dielectric liner 64' (which includes vertical portions of the second contiguous dielectric liner 64L in the second device region 200) and the at least one second semiconductor fin 40. For example, if the second disposable semiconductor material portions 41 include germanium or a germanium-including semiconductor alloy and if the at least one first semiconductor fin 30 includes silicon, the first disposable semiconductor material portions 31 can be removed by a wet etch employing a mixture of hydrogen peroxide and hydrofluoric acid.

A pair of second cavities 43 can be formed in volumes from which the second disposable semiconductor material portions 41 are removed. Each second cavity 41 formed upon removal of the second disposable semiconductor material portions 41 is laterally enclosed by sidewalls of the vertical portions of the second-device first dielectric liner 62' and one or more sidewalls of the at least one second semiconductor fin 40. The second mask layer 67 can be subsequently removed, for example, by ashing.

Referring to FIGS. 15A and 15B, second active semiconductor regions (4S, 4D) can be formed by a second selective deposition process, while the first active semiconductor regions (3S, 3D) are present on the at least one first semiconductor fin 30. The second active semiconductor regions (4S, 4D) can be formed on physically exposed semiconductor surfaces of the at least one second semiconductor fin 40 by selective deposition of a semiconductor material. During the second selective deposition process, the deposited semiconductor material forms the second active semiconductor regions (4S, 4D) within the second cavities 43, while the first-device second dielectric liner 64 prevents deposition of any semiconductor material in the first device region 100. The second active semiconductor regions (4S, 4D) can include a second source region 4S and a second drain region 4D.

In one embodiment, the second selective deposition process can be a second selective epitaxy process. During the second selective epitaxy process, the deposited semiconductor material grows from physically exposed semiconductor surfaces, which include sidewall surfaces and recessed horizontal surfaces of the at least one second semiconductor fin 40. The semiconductor material does not grow from dielectric surfaces such as the surfaces of the second dielectric liners (62, 62') and the shallow trench isolation layer 20.

In one embodiment, the second active semiconductor regions (4S, 4D) can be epitaxially aligned to the single crystalline structure of the at least one second semiconductor fin 40. The second active semiconductor regions (4S, 4D) can include the same semiconductor material as, or a semiconductor material different from, the semiconductor material of the at least one second semiconductor fin 40. In one embodiment, the at least one second semiconductor fin 40 can include silicon, and the second active semiconductor regions (4S, 4D) can include a doped silicon germanium alloy or a doped silicon carbon alloy. In one embodiment, the at least one second semiconductor fin 40 can include silicon, and the first active semiconductor regions (3S, 3D) can include one of a doped silicon germanium alloy and a doped silicon carbon alloy, and the second active semiconductor regions (4S, 4D) can include the other of the doped silicon germanium alloy and the doped silicon carbon alloy.

The lateral extent of the second active semiconductor regions (4S, 4D) is confined by the second-device first dielectric liner 62'. Thus, the horizontal cross-sectional shapes of the second active semiconductor regions (4S, 4D) can be identical to the horizontal cross-sectional shapes of the second disposable semiconductor material portions 41.

In one embodiment, the second active semiconductor regions (4S, 4D) can be formed with in-situ doping during the second selective epitaxy process. Thus, the second active semiconductor regions (4S, 4D) can be formed as doped semiconductor material portions with epitaxial alignment to the at least one second semiconductor fin 40. Alternatively, the second active semiconductor regions (4S, 4D) can be formed by ex-situ doping. In this case, the second active semiconductor regions (4S, 4D) can be formed as intrinsic semiconductor material portions with epitaxial alignment to the at least one second semiconductor fin 40, and electrical dopants can be subsequently introduced into the second active semiconductor regions (4S, 4D) to convert the second active semiconductor regions (4S, 4D) into doped semiconductor material portions.

After formation of the second active semiconductor regions (4S, 4D), the at least one second semiconductor fin 40 constitutes at least one body region of another field effect transistor. A p-n junction can be formed at the interfaces between each adjoining pair of at least one second semiconductor fin 40 and the second active semiconductor regions (4S, 4D).

The exemplary semiconductor structure includes a first fin field effect transistor and a second fin field effect transistor located on a substrate 10. The first fin field effect transistor is in the first device region 100, and the second fin field effect transistor is in the second device region 200. A first dielectric liner (i.e., the first-device first dielectric liner 62) includes a first dielectric material and laterally contacts a source region and a drain region (i.e., the first active semiconductor regions (3S, 3D)) of the first fin field effect transistor. Another first dielectric liner (i.e., the second-device first dielectric liner 62') includes the first dielectric material and laterally contacts a source region and a drain region (i.e., the second active semiconductor regions (4S, 4D)) of the second fin field effect transistor. A second dielectric liner (i.e., the first-device second dielectric liner 64) includes a second dielectric material and contacts top surfaces of the source region and the drain region of the first fin field effect transistor. Another second dielectric liner (i.e., the second-device second dielectric liner) includes the second dielectric material and includes a portion that has an L-shaped vertical cross-sectional shape and laterally surrounds the second-region first dielectric liner 62'.

The source region and the drain region (i.e., the second active semiconductor regions (4S, 4D)) of the second fin field effect transistor contact the second-device second dielectric liner 64' at interfaces having the same width as the thickness of the second-device second dielectric liner 64'. In contrast, the source region and the drain region (i.e., the first active semiconductor regions (3S, 3D)) of the first fin field effect transistor contact the first-device second dielectric liner 62 at interfaces having a greater width than the thickness of the first-device second dielectric liner 64.

The shallow trench isolation layer 20 is an insulator layer that laterally surrounding each of the first and second field effect transistors. The first-device second dielectric liner 64 contacts the insulator layer, and the bottommost surface of the second-device second dielectric liner 64' is vertically spaced from the insulator layer by the thickness of the second-device first dielectric liner 62'.

Referring to FIGS. 16A and 16B, a planarization dielectric layer 80 is formed on the top surfaces and sidewall surfaces of the first-device second dielectric liner 64, on the top surfaces and sidewall surfaces of the second-device second dielectric liner 64', and on the top surfaces of the second active semiconductor regions (4S, 4D). The planarization dielectric layer 80 is a dielectric material layer that is formed directly on the second active semiconductor regions (4S, 4D). The planarization dielectric layer 80 is vertically spaced from the first active semiconductor regions (3S, 3D) by the first-device second dielectric liner 64, which is a remaining portion of the second contiguous dielectric liner 64L. The planarization dielectric layer 80 can be subsequently planarized to provide a planar top surface. In one embodiment, the planarization of the planarization dielectric layer 80 can be performed by chemical mechanical planarization (CMP).

In one embodiment, the topmost portion of the first-device second dielectric liner 64 can be removed from above the top surfaces of the gate structures (51, 55). Subsequently, the gate structures (51, 55) can be replaced with replacement gate structures (50, 52), each of which includes a gate dielectric 50 and a gate electrode 52. Each gate dielectric 50 can include a silicon-based dielectric material such as silicon oxide and/or a high dielectric constant (high-k) dielectric material including a dielectric metal oxide and having a dielectric constant greater than 8.0. Each gate electrode 52 includes at least one conductive material. The at least one conductive material can include a doped semiconductor material and/or a conductive metallic material.

The first gate spacer 56 in the first device region 100 laterally surrounds the gate electrode (50, 52) of the first fin field effect transistor and contacts a sidewall of the first-device first dielectric liner 62. The second gate spacer 56 in the second device region 200 laterally surrounds the gate electrode (50, 52) of the second fin field effect transistor and contacts a sidewall of the second-device first dielectric liner 62'.

Figure 17A:
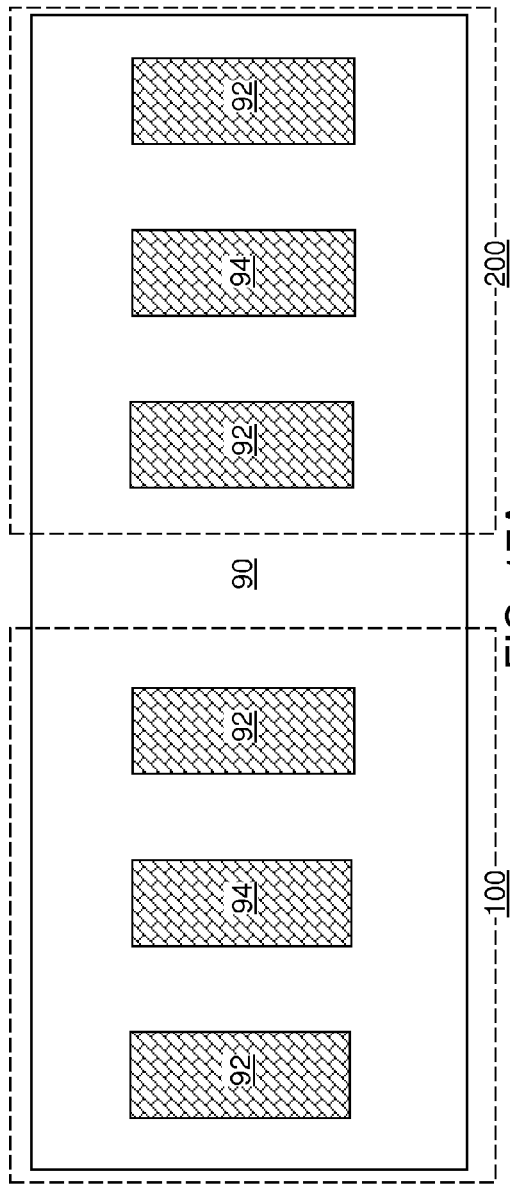
FIG. 17A is a top-down view of the exemplary semiconductor structure after formation of a contact level dielectric layer and various contact via structures according to an embodiment of the present disclosure.
Figure 17B:
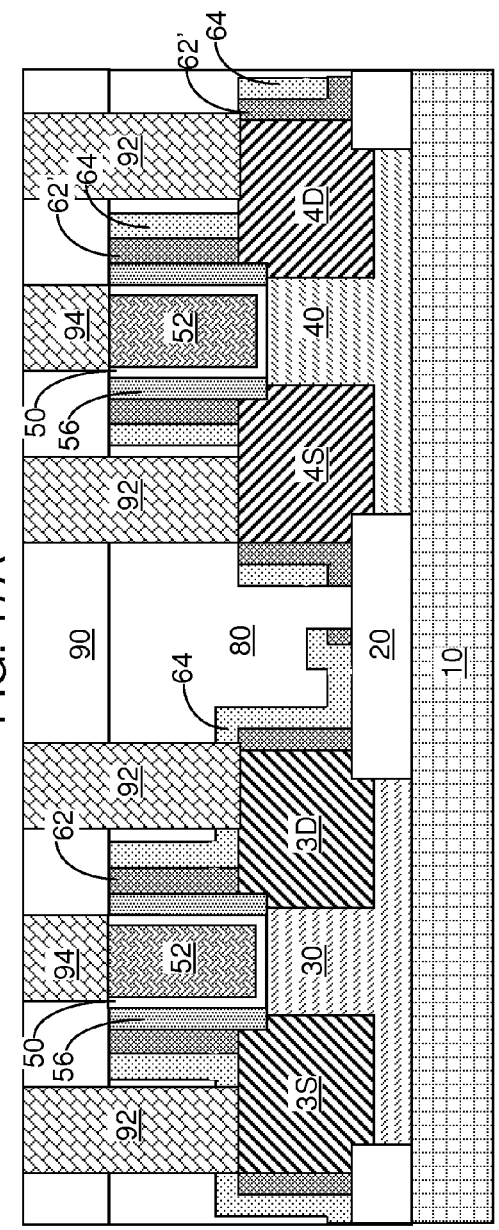
FIG. 17B is a vertical cross-sectional view of the exemplar semiconductor structure of FIG. 17A according to an embodiment of the present disclosure.

Referring to FIGS. 17a and 17B, a contact level dielectric layer 90 is formed over the planarization dielectric layer 80. The contact level dielectric layer 90 includes a dielectric material such as silicon oxide, silicon nitride, organosilicate glass, or combinations thereof. Optionally, the top surface of the contact level dielectric layer 90 can be planarized.

Active region contact via structures 92 can be formed through the contact level dielectric layer 90 and the planarization dielectric layer 80 to provide electrical contacts to the active semiconductor regions (3S, 3D, 4S, 4D). Gate contact via structures 94 can be formed through the contact level dielectric layer 90 to provide electrical contacts to the gate electrodes 52.

Referring to FIGS. 18A and 18B, a variation of the exemplary semiconductor structure can be derived from the exemplary semiconductor structure by forming a stack of a gate dielectric 150 and a gate electrode 152 in lieu of each disposable gate structure (51, 55) that includes a lower disposable gate material portions 51 and an upper disposable gate material portions 55. In this case, the step of replacement of the disposable gate structures (51, 55) with replacement gate structures (50, 52) may be omitted. Further, the planarization dielectric layer 80 and the contact level dielectric layer 90 may be formed as two separate layers or as a single dielectric layer.

The structures of the present disclosure can provide the same faceting characteristics for the horizontal cross-sectional shapes of the first and second active semiconductor regions (3S, 3D, 4S, 4D). Thus, parasitic capacitance characteristics of the first field effect transistor and the second field effect transistor can be identical or can be substantially matched, thereby enabling a complementary metal oxide semiconductor (CMOS) circuitry in which parasitic capacitances of p-type field effect transistors and n-type field effect transistors are identical or substantially matched.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
    a first fin field effect transistor and a second fin field effect transistor located on a substrate;
    a first dielectric liner comprising a first dielectric material and laterally contacting a source region and a drain region of said first fin field effect transistor;
    another first dielectric liner comprising said first dielectric material and laterally contacting a source region and a drain region of said second fin field effect transistor;
    a second dielectric liner comprising a second dielectric material and contacting top surfaces of said source region and said drain region of said first fin field effect transistor;
    another second dielectric liner comprising said second dielectric material and including a portion that has an L-shaped vertical cross-sectional shape and laterally surrounds said another first dielectric; and
    a dielectric material layer in contact with said source region and said drain region of said second fin field effect transistor and spaced from said source region and said drain region of said first fin field effect transistor by said second dielectric liner.

2. The semiconductor structure of claim 1, further comprising:
    a first gate spacer laterally surrounding a gate electrode of said first fin field effect transistor and contacting a sidewall of said first dielectric liner; and
    a second gate spacer laterally surrounding a gate electrode of said second fin field effect transistor and contacting a sidewall of said another first dielectric liner.

3. The semiconductor structure of claim 2, wherein said L-shaped vertical cross-sectional shape has a lateral width that is the same as a sum of a thickness of said first dielectric liner and a thickness of said second dielectric liner.

4. The semiconductor structure of claim 1, further comprising an insulator layer laterally surrounding each of said first and second field effect transistors, wherein said second dielectric liner contacts said insulator layer and a bottommost surface of said another second dielectric liner is vertically spaced from said insulator layer by a thickness of said another first dielectric liner.

5. The semiconductor structure of claim 1, wherein thicknesses of said first dielectric liner and said another first dielectric liner are the same, and thicknesses of said second dielectric liner and said another second dielectric liner are the same.

6. The semiconductor structure of claim 1, wherein outermost sidewalls of said another second dielectric liner are vertically coincident with outer sidewalls of said another first dielectric liner.

7. The semiconductor structure of claim 1, wherein said source region and said drain region of said second fin field effect transistor contact said another second dielectric liner at interfaces having a same width as a thickness of said another second dielectric liner.

8. The semiconductor structure of claim 7, wherein said source region and said drain region of said first fin field effect transistor contact said second dielectric liner at interfaces having a greater width than a thickness of said second dielectric liner.

9. The semiconductor structure of claim 1, wherein said first fin field effect transistor comprises a first semiconductor fin and said second fin field effect transistor comprises a second semiconductor fin.

10. The semiconductor structure of claim 9, wherein said first semiconductor fin comprises a same semiconductor material as said second semiconductor fin.

11. The semiconductor structure of claim 9, wherein said first semiconductor fin comprises a different semiconductor material as said second semiconductor fin.

12. The semiconductor structure of claim 9, wherein said first semiconductor fin comprises a same height as said second semiconductor fin.

13. The semiconductor structure of claim 1, further comprising a shallow trench dielectric layer located between said first fin field effect transistor and said second fin field effect transistor, said shallow trench dielectric layer having a bottommost surface in direct physical contact with a topmost surface of said substrate.

14. The semiconductor structure of claim 1, said first fin field effect transistor and said second fin field effect transistor comprise, from bottom to top, a gate dielectric material and a gate electrode.

15. A semiconductor structure comprising:
  a first fin field effect transistor and a second fin field effect transistor located on a substrate;
  a first dielectric liner comprising a first dielectric material and laterally contacting a source region and a drain region of said first fin field effect transistor;
  another first dielectric liner comprising said first dielectric material and laterally contacting a source region and a drain region of said second fin field effect transistor;
  a second dielectric liner comprising a second dielectric material and contacting top surfaces of said source region and said drain region of said first fin field effect transistor;
  another second dielectric liner comprising said second dielectric material and including a portion that has an L-shaped vertical cross-sectional shape and laterally surrounds said another first dielectric liner; and
  an insulator layer laterally surrounding each of said first and second field effect transistors, wherein said second dielectric liner contacts said insulator layer and a bottommost surface of said another second dielectric liner is vertically spaced from said insulator layer by a thickness of said another first dielectric liner.

16. A semiconductor structure comprising:
  a first fin field effect transistor and a second fin field effect transistor located on a substrate;
  a first dielectric liner comprising a first dielectric material and laterally contacting a source region and a drain region of said first fin field effect transistor;
  another first dielectric liner comprising said first dielectric material and laterally contacting a source region and a drain region of said second fin field effect transistor;
  a second dielectric liner comprising a second dielectric material and contacting top surfaces of said source region and said drain region of said first fin field effect transistor;
  another second dielectric liner comprising said second dielectric material and including a portion that has an L-shaped vertical cross-sectional shape and laterally surrounds said another first dielectric liner; and
  a shallow trench dielectric layer located between said first fin field effect transistor and said second fin field effect transistor, said shallow trench dielectric layer having a bottommost surface in direct physical contact with a topmost surface of said substrate.

* * * * *